United States Patent [19]

Oyanagi

[11] Patent Number: 5,402,359
[45] Date of Patent: Mar. 28, 1995

[54] METHOD AND APPARATUS FOR DETERMINING WIRING ROUTES BY UTILIZING ARTIFICIAL NEURAL NETWORKS

[75] Inventor: Shigeru Oyanagi, Kanagawa, Japan

[73] Assignee: Kabushiki Kaisha Toshiba, Tokyo, Japan

[21] Appl. No.: 763,448

[22] Filed: Sep. 20, 1991

[30] Foreign Application Priority Data

Sep. 21, 1990 [JP] Japan .................. 2-250372

[51] Int. Cl.$^6$ ............................................. G06F 15/20
[52] U.S. Cl. ................................ 364/491; 364/489; 364/490
[58] Field of Search ............... 364/488, 489, 490, 491, 364/807

[56] References Cited

U.S. PATENT DOCUMENTS

| | | | |
|---|---|---|---|
| 4,580,228 | 4/1986 | Noto | 364/491 |
| 4,593,363 | 6/1986 | Burstein et al. | 364/491 |
| 4,719,591 | 1/1988 | Hopfield et al. | 364/807 |
| 4,855,929 | 8/1989 | Nakajima | 364/490 |
| 5,032,991 | 7/1991 | Davidson et al. | 364/489 |
| 5,198,987 | 3/1993 | Shindo et al. | 364/490 |
| 5,200,908 | 4/1993 | Date et al. | 364/491 |

OTHER PUBLICATIONS

Hierarchical Wire Routing, Michael Burstein and Richard Pelavin, IEEE Transactions on Computer-Aided Design, vol. CAD-2, No. 4, Oct. 1983.

*Primary Examiner*—Kevin J. Teska
*Assistant Examiner*—Stephen J. Walder, Jr.
*Attorney, Agent, or Firm*—Oblon, Spivak, McClelland, Maier & Neustadt

[57] ABSTRACT

A method for determining routes of wiring nets by utilizing artificial neural networks includes the steps of dividing the wired area into smaller areas, representing each boundary through which one wiring net passes is capable of passing as an artificial neuron, changing an output value of the artificial neuron according to whether or not the wiring net actually passes through the boundary, composing an artificial neural network in which the interaction between the artificial neurons is taken into consideration according to one or more prescribed conditions restricting each route of the wiring nets while changing the output values of the artificial neurons, converging the output values of all artificial neurons, and determining the routes of all wiring nets by judging whether or not each wiring net passes through a boundary according to the converged output values of the artificial neurons.

15 Claims, 14 Drawing Sheets

ROUTES OF A WIRING NET CONNECTING BETWEEN SMALL AREAS A,B

ROUTES OF A WIRING NET CONNECTING BETWEEN SMALL AREAS A,C

ROUTES OF A WIRING NET CONNECTING BETWEEN SMALL AREAS A,D

ROUTES OF A WIRING NET CONNECTING BETWEEN SMALL AREAS B,C

ROUTES OF A WIRING NET CONNECTING BETWEEN SMALL AREAS B,D

ROUTES OF A WIRING NET CONNECTING BETWEEN SMALL AREAS C,D

ROUTES OF A
WIRING NET
CONNECTING
BETWEEN
BOUNDARIES R1,R4

ROUTES OF A
WIRING NET
CONNECTING
BETWEEN
BOUNDARIES R1,R4

ROUTES OF A
WIRING NET
CONNECTING
BETWEEN
BOUNDARIES R3

ROUTES OF A
WIRING NET
CONNECTING
BETWEEN
BOUNDARIES R5,R8

WIRING NET
: L1

WIRING NET
: L3

WIRING NET
: L5

WIRING NET
: L6

WIRING NET: L1

WIRING NET: L5

WIRING NET: L3

WIRING NET: L6

SMALL AREA: A
(A1)
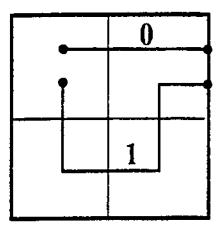
WIRING NET
:L1
FIG. 21(A)
FIG. 21(B)
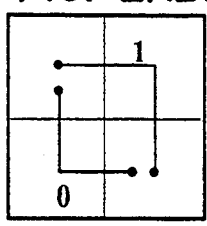
WIRING NET
:L2
FIG. 21(C)
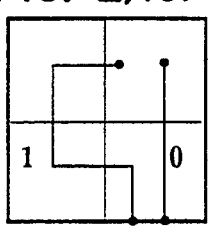
WIRING NET
:L3
FIG. 21(D)
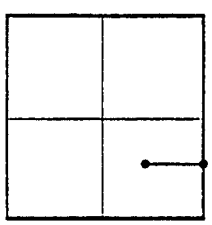
WIRING NET
:L5
FIG. 21(E)
SMALL AREA: B
(A2)
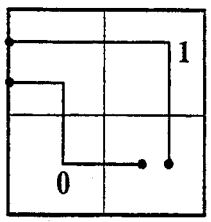
WIRING NET
:L1
FIG. 21(F)
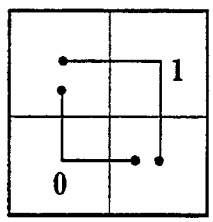
WIRING NET
:L4
FIG. 21(G)
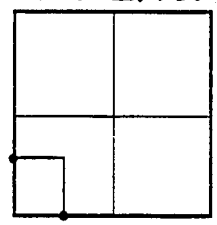
WIRING NET
:L5
SMALL AREA: C
(A3)
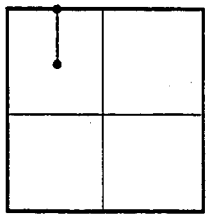
FIG. 21(H)
WIRING NET
:L5
FIG. 21(I)
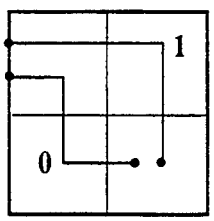
WIRING NET
:L6
FIG. 21(J)
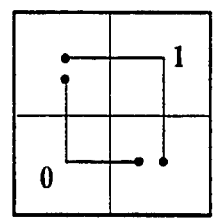
WIRING NET
:L8
SMALL AREA: D
(A4)
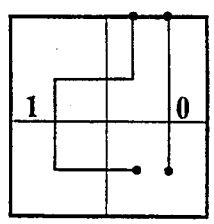
FIG. 21(K)
WIRING NET
:L3
FIG. 21(L)
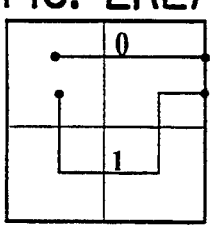
WIRING NET
:L6
FIG. 21(M)
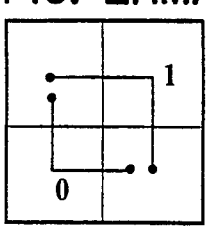
WIRING NET
:L7

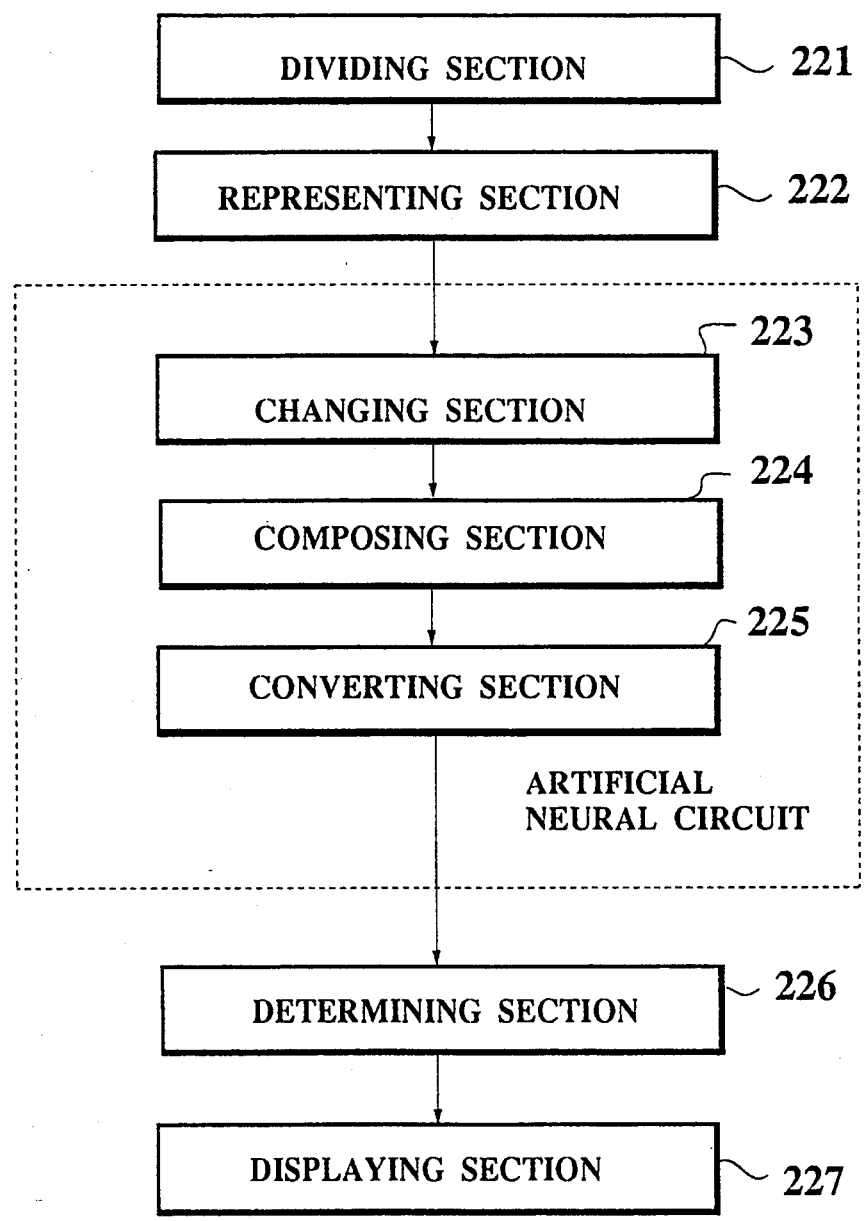

METHOD AND APPARATUS FOR DETERMINING WIRING ROUTES BY UTILIZING ARTIFICIAL NEURAL NETWORKS

BACKGROUND OF THE INVENTION

1. Field of the Invention

The present invention relates to a method and an apparatus for determining wiring routes by utilizing an artificial neural network in which wiring problems in large-scale integrated circuits are solved.

2. Description of the Background Art

As usual, in the case where wiring routes are determined in large-scale integrated (LSI) circuits, on condition that locations of the circuit compositions are provided on the chip in which the circuit is arranged and a group of wires are regarded as a group of two-terminal nets (wires for connecting between the circuit compositions), there are so-called wiring problems for determining the wiring routes while satisfying the electrical and physical conditions.

The above wiring problems are treated as the problems for determining the routes of all two-terminal nets (wiring nets). In this case, it is assumed that wiring capacity exists in the boundary dividing the areas which are normally provided in a two-dimensional wiring grid, where the wiring capacity refers to the allowable number of wires passing through the boundary between the areas.

In a conventional method for solving the above wiring problems, for example, a maze method is known (see, C.Y. IRE Trans. on Electronic Computers, pp. 346-365 Sep. 1961). In the method, an algorithm in which a wiring designer determines the wiring routes in the grid by attaching an label to each area in turn from a starting point while avoiding wiring forbidden areas is repeated until arriving at a goal point or being impossible to attach the label because a new area to be attached to the label is not able to be found.

According to the above method, the designer can always reach the goal point for a single wire if a wiring route to be determined exists. Moreover, the determined route is the shortest one.

However, because the maze method is the algorithm for determining all wiring routes in turn, a lot of time is consumed to determine all wiring routes in a LSI circuit with a large number of wires. Moreover, it is required to set the order of the wiring in advance so that the determination of the wiring routes is sometimes impossible if the order of the wiring is not adequate even if through wiring routes exist.

Further, the determination of the wiring order depends on the arrangement of the circuit and the circuit compositions so that it is difficult to make a general guide.

Therefore, when it is impossible to determine a wiring route in the conventional wiring method, the wiring route is normally corrected by hand or an automatic tearing-off-rewiring method is utilized. In the automatic tearing-off-rewiring method, a wiring route determined by attaching the label is cancelled by tearing the label off and a new wiring route is determined.

Therefore, in the case where the wiring route is corrected by hand, it takes much time and it is difficult to determine the wiring routes so that wiring errors easily occur. On the other hand, in the case where the automatic tearing-off-rewiring method is utilized, because a turning-back work called as a back track is performed, a working time increases.

As mentioned above, in the case where the wiring problems of LSI circuit are solved by utilizing the conventional method, the wiring routes are determined in turn while consuming the much time. Moreover, it is sometimes impossible to determine the wiring routes when the wiring order is not adequate.

SUMMARY OF THE INVENTION

An object of the present invention is to provide, with due consideration to the drawbacks of conventional methods, a method and an apparatus for determining routes of wiring nets by utilizing an artificial neural network in which the wiring problems in the LSI circuit with a large number of circuit components are solved at a high speed.

Another object of the present invention is to provide, with due consideration to the drawbacks of conventional methods, a method and an apparatus for practically determining routes of wiring nets by utilizing artificial neural networks in which an increase of size is prevented and a large scale problem is efficiently solved by utilizing artificial neurons as small as possible.

These objects are achieved by the provision of a method for determining a plurality of routes in an area by utilizing an artificial neural network, comprising the steps of:

dividing the area into a plurality of small areas;

representing each boundary between the divided possibly small areas by an artificial neuron for each route which passes through the boundary;

changing an output value of the artificial neuron according to whether or not a route actually passes through the boundary which is represented by the artificial neuron;

composing an artificial neural network in which the interaction between the artificial neurons is considered while changing the output values of the artificial neurons;

converging the output values of all artificial neurons which compose the artificial neural network; and determining all routes by Judging whether or not each route passes through the boundary represented by the artificial neuron according to the output values of the artificial neurons.

In the above configuration, the area in which the routes should be determined is divided into the small areas. In this case, each route starting from a starting point must pass through the boundary between the small areas many times to reach to a finishing point. Therefore, to determine the route, a designer must decide the boundaries through which the route passes. In the present invention, the designer can Judge whether or not the route passes through a specific boundary by utilizing the artificial neural network. That is, each boundary is represented by one artificial neuron so that the output of the artificial neuron is changed according to the condition whether or not the route passes through the boundary in the artificial neural network.

Accordingly, the designer can rapidly and with high accuracy determine the routes by utilizing the artificial neural network.

The above objects are also achieved by the provision of a method for determining a plurality of routes of wiring nets in a wired area by utilizing artificial neural networks, comprising the steps of:

dividing the wired area into a plurality of small areas;

representing each boundary through which one wiring net possibly passes by an artificial neuron, each boundary being arranged between the small areas;

changing an output value of the artificial neuron according to whether or not the wiring net actually passes through the boundary which is represented by the artificial neuron;

composing an artificial neural network in which the interaction between the artificial neurons is considered according to one or more prescribed conditions restricting each route of the wiring nets while changing the output values of the artificial neurons;

converging the output values of all artificial neurons which compose the artificial neural network; and determining the routes of all wiring nets by judging whether or not each wiring net passes through the boundary represented by the artificial neuron according to the converged output values of the artificial neurons.

In the above configuration according to a first aspect of the present invention, the wiring problems in the LSI circuit are rapidly solved by determining the routes of the wiring nets in parallel by utilizing the artificial neural network.

Specifically, in the case where the number of boundaries on a wiring grid is, for example, N and the number of wiring routes is M, N×M artificial neurons are utilized and all artificial neurons are interconnected to compose the artificial neural network. Thereafter, when the artificial neural network is converged, the wiring routes are determined because the output values of the artificial neurons are converged to be Judged whether or not each wiring net passes through each boundary between divided small areas.

That is, for example, in the case where the output value of each artificial neuron is set to 0 or 1 initially, the output of each artificial neuron is converged to a determined value of 0 or 1 by a threshold operation in a continuous mode when the artificial neural network is converged.

When the output value of the artificial neuron is 1, it is judged that the corresponding wiring net passes through the boundary represented by the artificial neuron. On the other hand, when the output value of the artificial neuron is 0, it is Judged that the corresponding wiring net does not pass through the boundary.

Therefore, according to the convergence condition of the artificial neural network, it is judged whether or not each wiring net passes through one boundary so that the routes of all wiring nets are determined.

The above objects are further achieved by the provision of a method for determining a plurality of routes of wiring nets in a wired area by utilizing artificial neural networks, comprising the steps of:

dividing the wired area into a prescribed number of small areas;

representing each wiring net connected between the small areas by an artificial neuron;

changing an output value of the artificial neuron according to whether or not each route of one wiring net satisfies one or more prescribed restrictions, each route of one wiring net corresponding to one output value of the artificial neuron;

composing an artificial neural network in which the interaction between the artificial neurons is considered to select the wiring route satisfying one or more prescribed restrictions while changing the output values of the artificial neurons;

converging the output values of all artificial neurons which compose the artificial neural network;

determining the wiring routes corresponding to the converged output values of the artificial neurons; and repeating the dividing step, the representing step for representing the wiring nets and one or more new wiring nets by artificial neurons, the changing step, the composing step, the converging step, and the determining step for determining the routes of the wiring nets in more detail and the routes of the new wiring nets, the repeating step being repeated until the routes of all wiring nets in the wired area are determined.

In the above configuration according to a second aspect of the present invention, the wiring problem is a large scale combination problem. In the combination problem, it takes much time to determine the routes of all wiring nets in turn in a large scale area.

Therefore, the wired area is divided into, for example, four small areas so that the large scale combination problem is changed to many partial problems. That is, a part of wiring nets connected between the small areas are given priority to be determined their routes. Then, to determine the routes of the wiring nets in more detail and to determine the routes of the other part of wiring nets which exist in the identical small area, each small area is divided into, for example, four divided small areas. Therefore, by repeating the division of the small area, the routes of all wiring routes are determined in turn. In other words, the large scale combination problem is solved by repeatedly solving the partial problems.

Specifically, the entire wired area is divided into four small areas so that each wiring route passing through the boundary between the small areas is determined as the partial problems by utilizing an artificial neural network. In this case, each artificial neuron represents one wiring route and the output value of the artificial neuron is set to [0,1] so that the output of the artificial neuron is converged to a determined value 0 or 1 by an appropriate threshold operation when the artificial neural network is converged.

In more detail, two wiring routes are assumed for each wiring net so that it is determined which wiring routes through which the wiring net passes according to the output value of the artificial neuron. Then, each small area is further divided into four divided small areas to make sixteen divided small areas. By repeating the division operation, the wired area is subdivided into 64 pieces, 256 pieces, and so on so that all wiring routes are gradually determined with accuracy.

Accordingly, the present invention provides a method for obtaining the solution at a high speed and with high accuracy.

Moreover, the required number of artificial neurons is almost equal to the number of wiring routes so that a large scale problem can be solved by utilizing a realistic scale of artificial neural networks.

The first aspect of the method for determining the wiring routes is achieved by the provision of an apparatus for determining a plurality of routes of wiring nets in a wired area by utilizing artificial neural networks, comprising:

dividing means for dividing the wired area into a plurality of small areas;

representing means for representing each boundary through which one wiring net possibility passes by an artificial neuron, each boundary being arranged between the small areas divided by the dividing means;

changing means for changing an output value of the artificial neuron according to whether or not the wiring net actually passes through the boundary which is represented by the artificial neuron by the representing means;

composing means for composing an artificial neural network in which the interaction between the artificial neurons is considered according to one or more prescribed conditions restricting each route of the wiring nets while changing the output values of the artificial neurons by utilizing the changing means;

converging means for converging the output values of all artificial neurons which compose the artificial neural network composed by the composing means; and determining means for determining the routes of all wiring nets by judging whether or not each wiring net passes through the boundary represented by the artificial neuron according to the output values of the artificial neurons converged by the converging means.

In the above configuration, the first aspect of the method for determining the wiring routes can be easily performed.

The second aspect of the method for determining the wiring routes is achieved by the provision of an apparatus for determining a plurality of routes of wiring nets in a wired area by utilizing artificial neural networks, comprising:

dividing means for dividing the wired area into a prescribed number of small areas;

representing means for representing each wiring net connecting between the small areas divided by the dividing means by an artificial neuron;

changing means for changing an output value of the artificial neuron represented by the representing means according to whether or not each route of one wiring net satisfies one or more prescribed restrictions, each route of one wiring net corresponding to one output value of the artificial neuron;

composing means for composing an artificial neural network in which the interaction between the artificial neurons is considered to select the wiring route satisfying one or more prescribed restrictions while changing the output values of the artificial neurons by utilizing the changing means;

converging means for converging the output values of all artificial neurons composing the artificial neural network composed by the composing means;

determining means for determining the wiring routes corresponding to the output values of the artificial neurons converged by the converging means; and repeating means for repeating the dividing step, the representing step for representing the wiring nets and one or more new wiring nets by artificial neurons, the changing step, the composing step, the converging step, and the determining step for determining the routes of the wiring nets in more detail and the routes of the new wiring nets, the repeating step being repeated until the routes of all wiring net in the wired area are determined.

In the above configuration, the second aspect of the method for determining the wiring routes can be easily performed.

BRIEF DESCRIPTION OF THE DRAWINGS

FIGS. 21(a)–21(m) shows two possible patterns of routes of each wiring net L1 to L8 which connects between the divided small areas, wiring routes being shown for each small area and each wiring net.

FIG. 22 is a block diagram of a wiring apparatus for determining wiring routes by utilizing an artificial neural network according to the first aspect.

DETAILED DESCRIPTION OF THE PREFERRED EMBODIMENTS

Preferred embodiments according to a first aspect of the present invention are described with reference to FIGS. 1-7.

Figure 1:
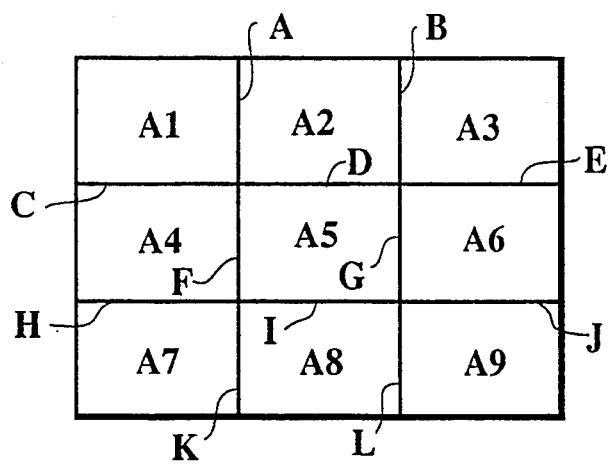
FIG. 1 schematically shows 3×3 two layers wiring grid of an embodiment according to a first aspect of the present invention.

FIG. 1 schematically shows 3×3 two layer wiring grid of the embodiments according to a first aspect of the present invention.

As shown in FIG. 1, the wiring grid is provided with nine small areas A1 to A9 and twelve boundaries A to L. Each boundary is arranged between the small areas.

In the wiring grid, the wires whose routes are to be determined are classified into many wiring nets which respectively have terminals (a starting point and a final point). Each terminal exists in one of the small areas.

In a first embodiment, the starting point of the wiring net exists in the small area A1 and the final point of the wiring net exists in the small area A9. In the first embodiment, the route of the wiring connected between the small area A1 and the small area A9 is determined as an example.

Figure 2:
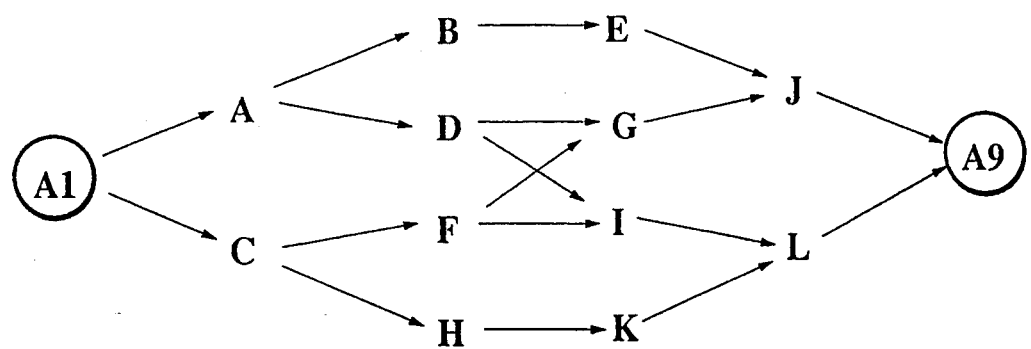
FIG. 2 shows a graph representation of a wiring route in the wiring grid shown in FIG. 1.

FIG. 2 shows a graph representation of a wiring route in the wiring grid shown in FIG. 1. In detail, the wiring route connected between the small area A1 and the small area A9 is represented by the graph with directions in which the boundaries A to L possibly passed by the wiring route are respectively represented by nodes A to L in an artificial neural network.

As shown in FIG. 2, each route arriving at the small area A9 from the small area A1 while following arrows is one of the shortest routes. The route A1→A→D→I→L→A9 is, for example, one of the shortest routes connected between the small area A1 and the small area A9. Each node A to L represented in the graph is represented by an artificial neuron (that is, each boundary is represented by an artificial neuron). That is, as mentioned hereinafter, each output value of the artificial neuron is determined by judging whether or not the route of the wiring net passes through each boundary A to L.

Next, a second embodiment according to a first aspect of the present invention is described based on the first embodiment. In the second embodiment, the routes of a plurality of wiring nets are simultaneously determined while utilizing the artificial neuron representation.

Figure 3:
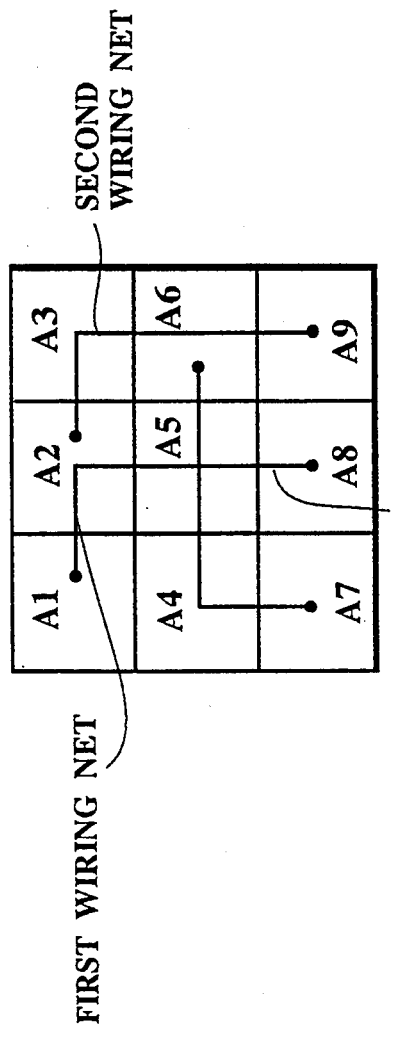
FIG. 3 shows, as an example, three wiring routes in the wiring grid shown in FIG. 1.

FIG. 3 shows, as an example, three wiring routes in the wiring grid shown in FIG. 1.

As shown in FIG. 3, a first wiring net connected between the small area A1 and the small area A8, a second wiring net connected between the small area A2 and the small area A9, and a third wiring net connected between the small area A6 and the small area A7 are determined in parallel in the two layer wiring grid.

Figure 4:
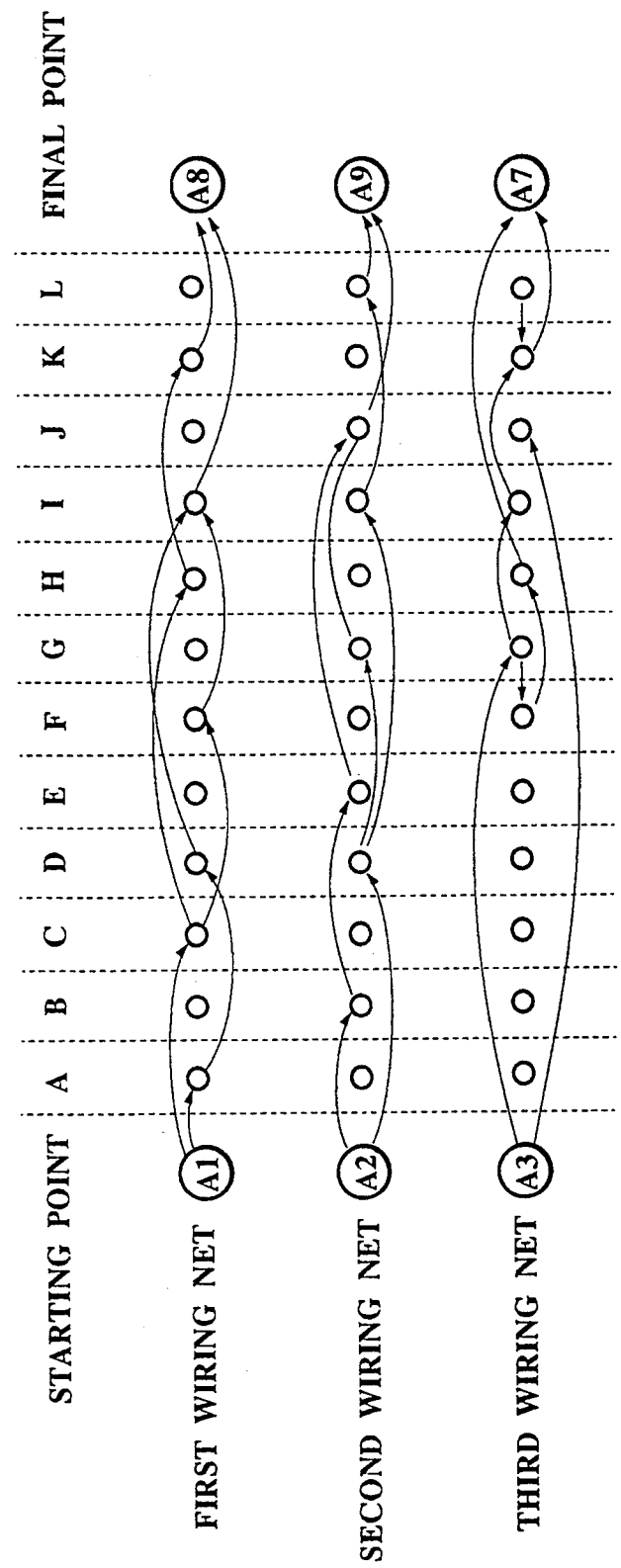
FIG. 4 shows graph representations of three wiring routes shown in FIG. 3.

FIG. 4 shows graph representations of the three wiring routes shown in FIG. 3.

As shown in FIG. 4, by Judging whether or not the arrows coming in and out each boundary (node A to L) exist, the number of wiring nets possibly passing through the same boundary can be determined.

For example, the boundary A is possibly passed through by only the first wiring net connecting between the small area A1 and the small area A8. On the other hand, the boundary D is possibly passed through by both the first and second wiring nets.

Next, the utilization of the artificial neural network is described for determining the routes of the wiring nets.

The method for solving the most suitable combination problem by utilizing the artificial neural network is called the Hopfield model and the model is well known.

In the Hopfield model, the output value of the artificial neuron No. i is set to Vi, the weight parameter between the artificial neurons No. i and No. j is set to Tij, and the external input parameter of the artificial neuron No. i is set to Ii. In this case, the converged condition of the artificial neural network is represented by an extreme minimum value of the energy function E(Vi,VJ) defined by the following equation.

$$E = -0.5 * \sum_j \sum_i Tij * Vi * Vj - \sum_i Ii * Vi \qquad (1)$$

That is, if an energy function Ex is represented by the quadratic form of the artificial neuron output variable, the most suitable wiring problem can be solved by utilizing the identity relation between the energy function Ex and the Hopfield energy function E(Vi,VJ). In detail, the weight parameter TiJ of the quadratic term and the external input parameter Ii of the linear term are found, then the converged solution can be obtained by operating the artificial neural network.

Therefore, if the wiring problem of the LSI circuit is represented by the above energy function E, the most suitable problem can be solved.

Next, a method for representing the wiring problem by an energy function while utilizing the artificial neural network is described.

For representing the right solution by the converged condition of the artificial neural network, the following restrictions must be satisfied.

1. Continuity of Wiring Route:

The route for passing through each boundary without cutting off the route exists for each wiring net between starting and final points of the wiring net.

2. Prohibition of Divergence and Junction:

Each wiring net is prohibited from diverging its wiring route or joining a plurality of wiring routes at an arbitrary boundary.

3. Restriction of Wiring Capacity:

The number of routes of wiring nets passing through a boundary must be less than an allowable value.

The above three conditions are represented by an energy function. In the energy function, the output value of the artificial neuron corresponding to the boundary X is specially set to Vix for the wiring net No. i.

The restriction of the continuity of the wiring routes is represented with reference to FIG. 3 as follows.

As for the first wiring net connecting between the small area A1 and the small area A8, $$E0 = V_{1A}V_{1D} + V_{1C}V_{1H} + V_{1C}V_{1F} + V_{1D}V_{1I} + V_{1F}V_{1I} + V_{1H}V_{1K} \qquad (2)$$

In the equation (2), the products of the output values of artificial neurons corresponding to the boundaries A to L are summed. In detail, Each term of the equation (2) corresponds to a link connected between two artificial neurons and each product is obtained from the outputs of the artificial neurons connected by the same link.

When the energy function E0 is a maximum value, the continuity of the wiring route is guaranteed. That is, in the case where two boundaries X, Y are close to the same small area, the wiring route is Judged to be continuous so that $V_{1X}V_{1Y}$ is equal to 1. On the other hand, in the case where two boundaries X, Y are not close to the same small area, the wiring route is judged not to be continuous so that $V_{1X}V_{1Y}$ is equal to 0.

Moreover, the output values $V_{1A}$, $V_{1C}$, $V_{1I}$, $V_{1K}$ of the artificial neurons A, C, I, K are added to the equation (2) to excite the terminals of the first wiring net as follows.

$$E1 = V_{1A}*V_{1D} + V_{1C}*V_{1H} + V_{1C}*V_{1F}V_{1D}* \\ V_{1I}V_{1F}*V_{1I} + V_{1H}*V_{1K} + V_{1A} + V_{1C} + \\ V_{1I} + V_{1K} \quad (3)$$

When the energy function E1 of the equation (3) is a maximum value, the continuity of the wiring route is guaranteed.

The continuity of both the second wiring net connecting between the small area A2 and the small area A9 and the third wiring net connecting between the small area A6 and the small area A7 is represented in the same manner as the first wiring net.

Next, the restriction as to the prohibition of the divergence and the junction is described with reference to FIG. 3 as follows.

As for the first wiring net connected between the small area A1 and the small area A8, $$E2 = V_{1A}*V_{1C} + V_{1F}*V_{1H} + V_{1I}*V_{1K} + V_{1D}*V_{1F} \quad (4)$$

In equation (4), when the energy function E2 is an extreme minimum value, the prohibition of the divergence and the junction of the wiring routes is guaranteed. That is, the outputs of the artificial neurons A, C are prohibited to be 1 together. In the same manner, the outputs of the artificial neurons F, H, the outputs of the artificial neurons I, K, and the outputs of the artificial neurons D, F are respectively prohibited to be 1 together.

Next, the restriction as to the wiring capacity is described with reference to FIG. 3.

Initially, the lengths of all wiring routes are summed and the resultant sum is divided by the number of boundaries so that an average capacity N of the wiring route is found from the divided value.

The reason that the average capacity N can be found by the above calculation is as follows. The route length of the wiring nets between the boundaries is a constant value (a side length of the small area) so that the resultant sum is proportional to the frequency through which the boundaries are passed.

An energy function E3 representing the restriction of the wiring capacity is defined by utilizing the average capacity N as follows.

$$E3 = \sum_{x} \left( \sum_{i} V_{ix} - N \right)^2 \quad (5)$$

The energy function $E3(V_{1X})$ is defined as a sum of square of the differences between the number of wiring routes i passing through the boundary X and the average capacity N. By determining the output value $V_{1X}$ to allow the energy function E3 to be an extreme minimum value, the wiring routes pass through the boundaries under the condition of the average capacity N.

By considering the above three restrictions, a total energy according to the first aspect of the present invention is represented by the quadratic form of the output $V_{ix}$ of the artificial neurons. That is, the total energy function Ex is defined as follows by calculating the sum of each energy function which is multiplied by a parameter.

$$Ex = a*E1 + b*E2 + c*E3$$

Therefore, by solving the identity equation E=Ex in which the output values $V_i$ or $V_{ix}$ of the artificial neurons are variable, the weight parameter Tij between the artificial neurons i, j and the external input parameter Ii of the artificial neuron i are found. That is, as mentioned above, by comparing the parameter of the quadratic term of the variable $V_i$, $V_{ix}$ in one energy function with the other, the weight parameters TiJ are found.. In the same manner, by comparing the parameter of the linear term of the variable $V_i$, $V_{ix}$ in one energy function with the other, the external input parameters Ii are found.

Figure 5:
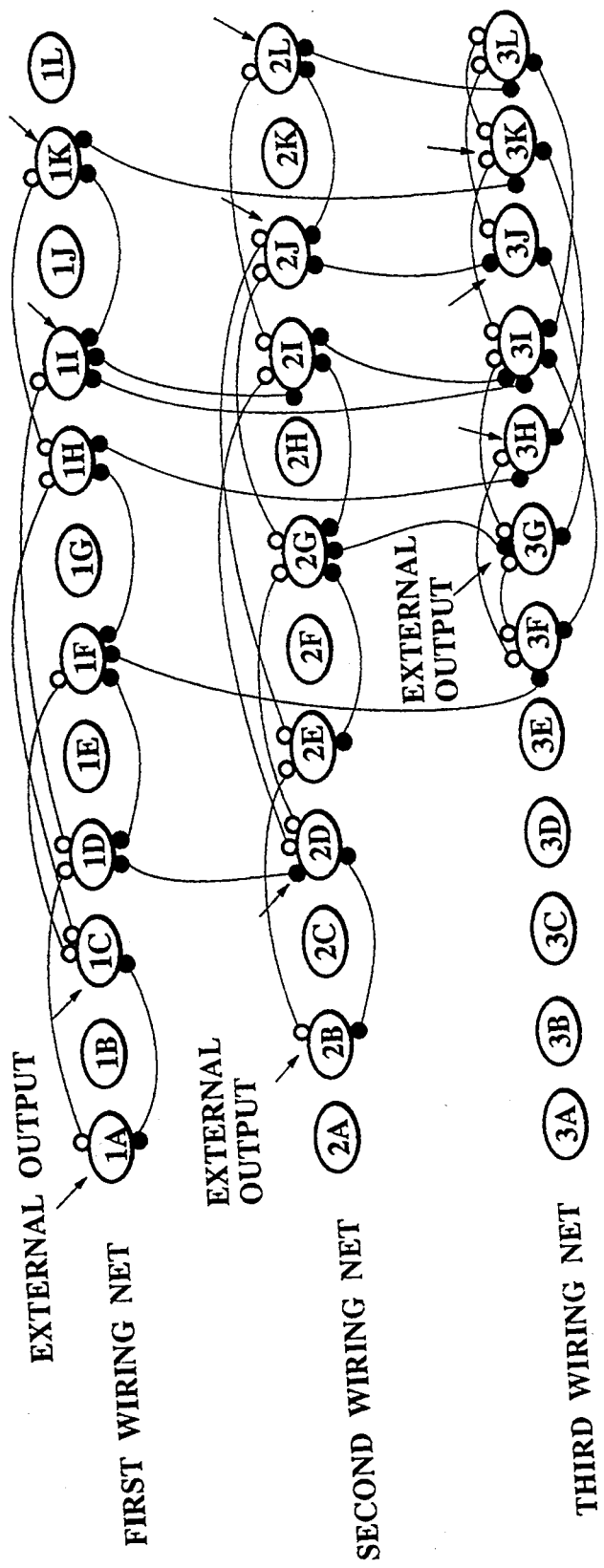
FIG. 5 shows an artificial neural network, in which weight parameters and external input parameters are found for three wiring routes shown in FIG. 3, related to artificial neurons.

FIG. 5 shows an artificial neural network, in which the weight parameters Tij and the external input parameters Ii are found for three wiring routes shown in FIG. 3, related to artificial neurons.

In FIG. 5, notations 1A to 1L mean the artificial neurons for the first wiring route (A1–A8), notations 2A to 2L mean the artificial neurons for the second wiring route (A2–A9), and notations 3A to 3L mean the artificial neurons for the third wiring route (A6–A7). Moreover, white circles close to the artificial neurons mean the positive weight parameter Tij and black circles close to the artificial neurons mean the negative weight parameter Tij. And, arrows directed to a part of the artificial neurons mean the external input parameter Ii added to the corresponding artificial neurons.

As shown in FIG. 5, the artificial neurons connected by the positive weight parameter Tij (>0) are excited, while the artificial neurons connected by the negative weight parameter Tij (<0) repel each other. By utilizing the weight parameters Tij and the external inputs Ii, the artificial neural network is converged to many values (many groups of output values $V_{ix}$ of the artificial neurons). That is, there are many solutions because the solution depends on initial values of the artificial neural network. One of the solutions is shown in FIG. 6.

Figure 6:
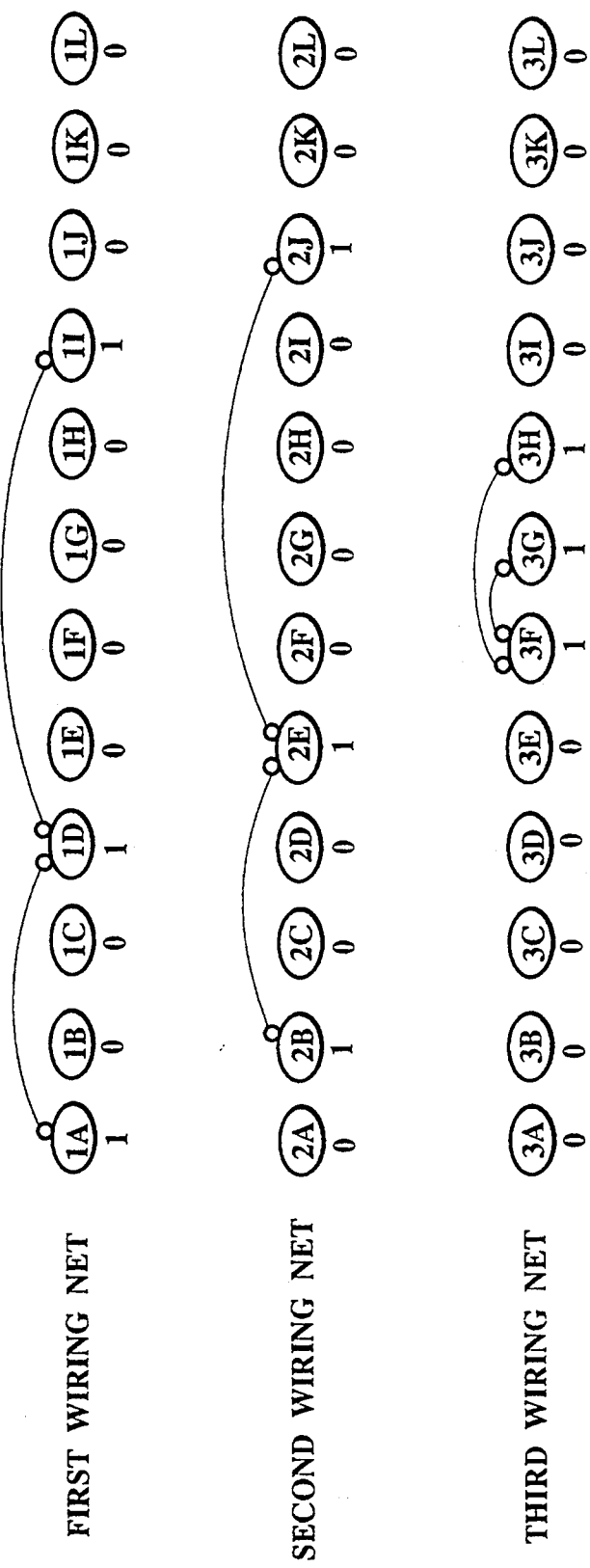
FIG. 6 shows a converged solution of the artificial neural network (that is, a group of output values of the artificial neurons) shown in FIG. 5 related to artificial neurons, the values being determined by utilizing the weight parameters TiJ and the external input parameters Ii.

FIG. 6 shows a converged solution of the artificial neural network (that is, a group of converged output values of the artificial neurons) shown in FIG. 5 related to artificial neurons, the values being determined by utilizing the weight parameters Tij and the external input parameters Ii.

As shown in FIG. 6, the converged output values $V_{ix}$ of the artificial neurons are one of the solutions in which the energy function Ex is minimized and correspond to the three wiring routes shown in FIG. 3.

Next, the procedure for finding the output values $V_{ix}$ of the artificial neurons is described with reference to FIG. 7.

Figure 7:
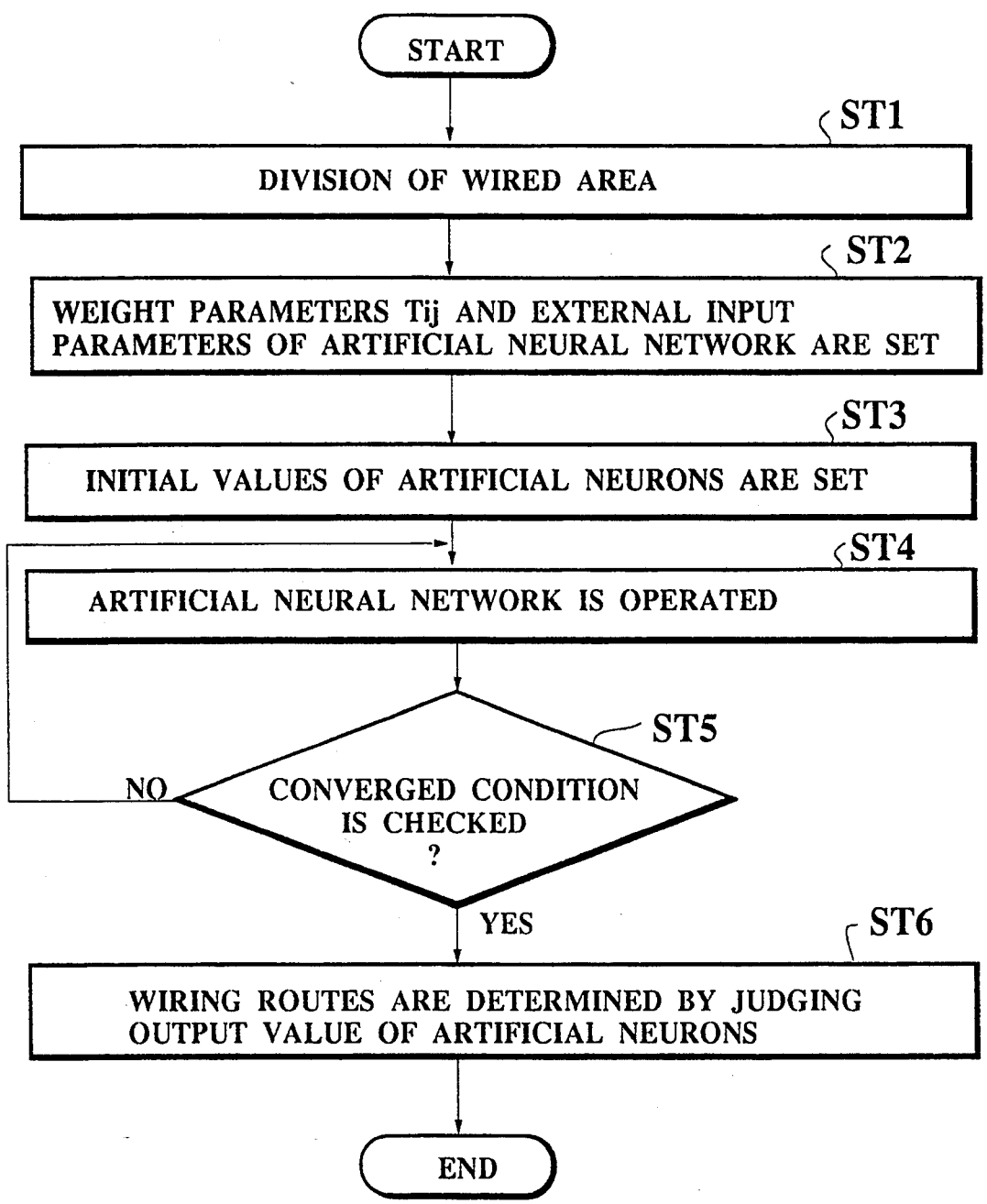
FIG. 7 is a flowchart showing the procedure for determining output values of artificial neurons according to a first aspect of the present invention.

FIG. 7 is a flowchart showing the procedure for determining output values $V_{ix}$ of artificial neurons according to a first aspect of the present invention.

Initially, in a step ST1, the wired area (wiring grid) is divided into a plurality of small areas so that each boundary between the divided small areas is represented as an artificial neuron with an output value $V_{ix}$. By the above representing operation, an artificial neural network is constructed while interconnecting the artificial neurons.

Then, in a step ST2, the weight parameters Tij and the external input parameters Ii of the artificial neural network are set. That is, the energy function Ex shown in the quadratic form with the variables $V_{ix}$ is compared with the Hopfield energy function E shown in the equation (1). Specifically, by comparing with the term $-0.5 * T_{ij} * V_i * V_j$ of the energy function E, the weight parameters Tij between the artificial neurons Vi, VJ are found. In the same manner, by comparing with the term $-I_i * V_i$ of the energy function E, the external input parameters Ii are found.

Then, in a step ST3, initial output values of the artificial neurons are set, the initial values are set near 0.5 by utilizing suitable random numbers.

Then, in steps ST4, ST5, the operation in the artificial neural network is repeated until the output values $V_{ix}$ of the artificial neurons are converged.

In the continuous model, when the output values $V_{ix}$ of the artificial neurons are converged, the procedure proceeds to a step ST6 so that a suitable threshold operation is performed for the converged output values $V_{ix}$. For example, in the case where a threshold value is set to 0.5, the converged output values $V_{ix}$ are operated to be set to 1 if the values are equal or more than 0.5. On the other hand, the converged output values $V_{ix}$ are operated to be set to 0 if the values are less than 0.5.

Therefore, the boundaries passed through by the wiring nets are determined. That is, when the converged output value $V_{ix}$ is equal to 1, the wiring net (No. i) passes through the boundary X. On the other hand, when the converged output value $V_{ix}$ is equal to 0, the wiring net (No. i) does not pass through the boundary X.

In the discrete model, the output values $V_{ix}$ of the artificial neurons are converged to 1 or 0.

Accordingly, in the wiring problem of the LSI circuit, the routes of the wiring nets can simultaneously be solved by utilizing the artificial neural network.

The above energy functions E1, E2, E3 are utilized as an example so that many modifications are capable. For example, there are many boundary groups such as (A, F, K), (B, G, L), or (H, I, J) in which the boundaries are aligned. In this case, for passing through one of the shortest routes, each route of the wiring nets must satisfy the restriction that the wiring route does not pass through two boundaries which belong to the same group. Therefore, a negative weight parameter can be set between the boundaries A and F, A and K, and F and K for the group (A, F, K). In other words, the above consideration of the negative weight parameter correspond to the addition of a following energy function E4 to the energy function Ex. The energy function E4 is as follows.

$$E4 = V_{iA}*V_{iF} + V_{iA}*V_{iK} + V_{iF}*V_{iK}$$

If an energy function satisfies that the function is represented by a quadratic equation of the output of the artificial neuron, the present invention is processed in the same manner by utilizing the energy function with the quadratic equation.

As mentioned above, each wiring net has an individual route. However, it is better that a plurality of wiring nets have the same route. In this case, a weight parameter Wi equivalent to the number of wiring nets is set and the output of the artificial neuron is changed to $W_i*V_i$ instead of Vi.

Moreover, the wiring grid is divided into $3 \times 3$. However, it is possible to divide the wiring grid into an arbitrary number of small areas.

Next, preferred embodiments according to a second aspect of the present invention are described with reference to FIG. 8 to FIG. 21.

Figure 8:
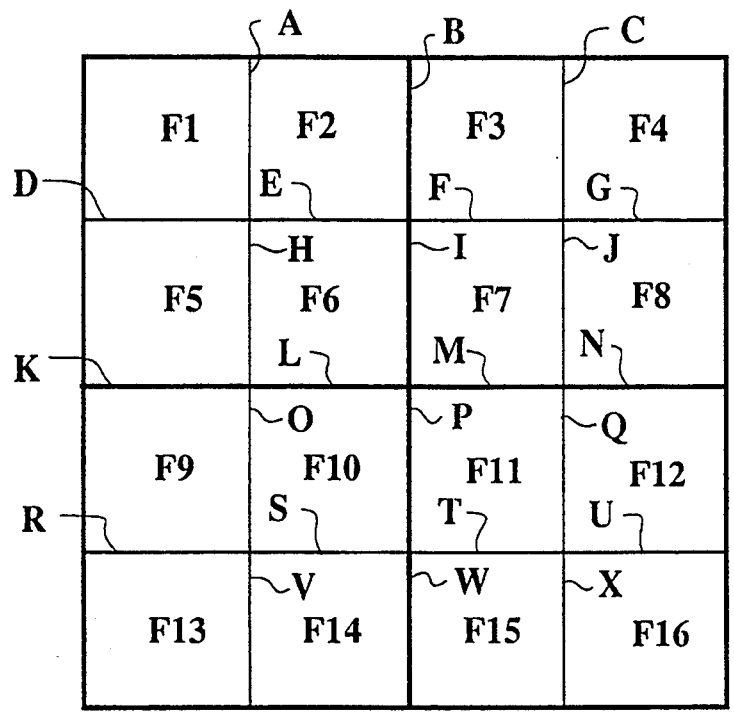
FIG. 8 schematically shows 4×4 two layers wiring grid of an embodiment according to a second aspect of the present invention.

FIG. 8 schematically shows a $4 \times 4$ two layer wiring grid of an embodiment according to a second aspect of the present invention.

As shown in FIG. 8, the wiring grid is provided with sixteen small areas F1 to F16 and twenty four boundaries A to X. Each boundary is arranged between the small areas.

Figure 9:
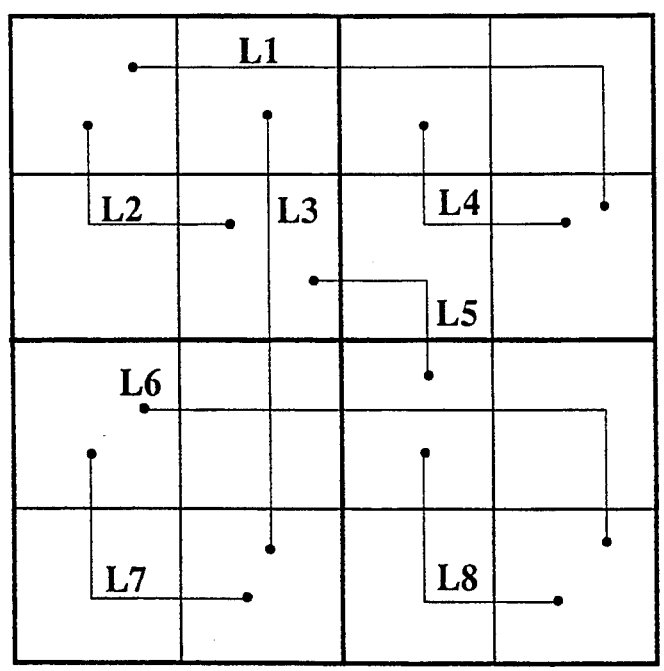
FIG. 9 shows, as an example, eight wiring routes in the wiring grid shown in FIG. 8, each wiring route satisfying a prescribed wiring capacity.

In the wiring grid, the wires to have their routes determined are classified to many wiring nets which respectively have terminals (a starting point and a final point). Each terminal exists in one of the small areas. Moreover, the wiring capacity of each boundary is 1. That is, the allowable number of wiring routes passing through an arbitrary boundary is 1. For example, eight routes of wiring nets L1 to L8 are shown in FIG. 9 while satisfying the wiring capacity.

To explain the second aspect of the present invention, many technical problems are described in turn as follows.

(1) Division of Wiring Problems to Many Partial Problem

The wiring problem is a large scale combination problem. In the combination problem, it takes much time to determine all wiring routes in a large scale area in turn. Therefore, the area is divided into the four small areas so that the large scale combination problem is changed to partial problems. That is, a part of wiring nets connected between the small areas are given priority to have their determined. Then, to determine the wiring routes in more detail and to determine routes of the other parts of wiring nets which exist in the identical small area, each small area is divided into four divided small areas. Therefore, by repeating the division of the small area, all wiring routes are determined in turn. In other words, the large scale combination problem is solved by repeating the solution of the partial problems.

Accordingly, the second aspect can be extended to a larger wired area than that of the present embodiment.

Figure 10:
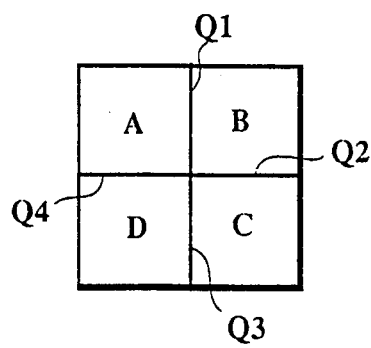
FIG. 10 shows four small areas made by dividing the wiring grid shown in FIG. 8.

FIG. 10 shows four small areas A, B, C, D made by dividing the wiring grid shown in FIG. 8.

As shown in FIG. 10, the boundaries Q1 to Q4 are respectively arranged between the small areas.

Next, two patterns of routes of each wiring net of which the terminals are connected between the small areas are described with reference to FIGS. 11A to 11F.

FIGS. 11A to 11F respectively show two patterns of routes of a wiring net connected between the small areas shown in FIG. 10 through one or more boundaries while satisfying restricting conditions.

To determine the route of each wiring net, it is important to determine the boundary through which each route passes. In this case, the shortest route is hopeful. However, a detouring route is considered at some extent. Moreover, it is considered as one restriction condition that the route of a wiring net which terminals exist in the identical small area is prohibited from extending to another small area. And, it is considered as another restriction condition that one route of the wiring net is prohibited from passing through an identical boundary more than twice.

According to the above conditions, there are six types of combinations of the wiring nets for connecting between the small areas as shown in FIGS. 11A to 11F through one or more boundaries. In each combination, there are two patterns of routes of a wiring net. One pattern of the wiring net has one output value of an artificial neuron while another pattern of the wiring net has another output value of the artificial neuron.

That is, in the second aspect, each wiring net is represented by an artificial neuron. For example, as to the artificial neuron representing the wiring net connecting between the small areas A and B, the output value of the artificial neuron is 0 when one route of the wiring net passes through the boundary between the small areas A and B, while the output value of the artificial neuron is 1 when another route of the wiring net passes through the small area A, the small area D, the small area C, and the small area B.

(2) Most Suitable Problem in Circuit Interconnected by Artificial Neurons and Application to LSI Wiring The method for solving the most suitable combination problem by utilizing the artificial neural network in which artificial neurons are interconnected is called the Hopfield model and the model is well known.

In the Hopfield model, the output value of the artificial neuron No. i is set to Vi, the weight parameter between the artificial neurons No. i and No. j is set to Tij, and the external input parameter of the artificial neuron No. i is set to Ii. In this case, the converged condition of the artificial neural network is represented by an extreme minimum value of the energy function $E(Vi,VJ)$ defined by the following equation in the same manner as the equation (1).

$$E = -0.5 * \sum_j \sum_i Tij * Vi * Vj - \sum_i Ii * Vi \qquad (6)$$

That is, if the most suitable problem is represented by the extreme minimum value problem of the quadratic form of the artificial neuron output variable, the most suitable wiring problem can be solved by utilizing the identity relation between a given energy function and the Hopfield energy function $E(Vi,Vj)$. In detail, the weight parameter Tij of the quadratic term and the external input parameter Ii of the linear term are found, then the converged solution can be obtained by operating the artificial neural network.

Therefore, in the case where the partial problems of the LSI wiring problem is represented by the equation (6), the most suitable problem can be solved.

Next, the matters to be considered for determining the route of each wiring net is described by utilizing the Hopfield energy function E.

(2.1) Equalized Distribution of Wiring Routes

When the wiring routes are locally concentrated in the LSI wiring operation, the determination of routes of the wiring nets becomes impossible easily. Therefore, to prevent the concentration of the wiring routes, the divided small areas are determined to distribute the wiring routes equally over the whole area. In detail, for example, in case of the division to four pieces, the equalization of the number of wiring routes passing through the boundaries Q1, Q2, Q3, or Q4 is represented by utilizing an energy function E5 as follows.

$$E5 = (n(Q1)-N)^2 + (n(Q2)-N)^2 + (n(Q3)-N)^2 + (n(Q4)-N)^2 \qquad (7)$$

Wherein, n(Q1), n(Q2), n(Q3), and n(Q4) respectively represent the number of wiring routes passing through the boundaries Q1, Q2, Q3, and Q4. The notation N represents an average capacity (the average number of wiring routes passing through each boundary). The average capacity N is defined by dividing the sum of all wiring net lengths by the number of boundaries Q1 to Q4. The number of wiring routes n(Q1), n(Q2), n(Q3), and n(Q4) are defined as follows.

$$n(Q1) = \sum_{i \in AB}(1 - Vi) + \sum_{i \in AC} Vi + \sum_{i \in AD} Vi + \sum_{i \in BC} Vi + \sum_{i \in BD} Vi + \sum_{i \in CD} Vi \qquad (8)$$

$$n(Q2) = \sum_{i \in AB} Vi + \sum_{i \in AC} Vi + \sum_{i \in AD} Vi + \sum_{i \in BC}(1 - Vi) + \sum_{i \in BD}(1 - Vi) + \sum_{i \in CD} Vi$$

$$n(Q3) = \sum_{i \in AB} Vi + \sum_{i \in AC}(1 - Vi) + \sum_{i \in AD} Vi + \sum_{i \in BC} Vi + \sum_{i \in BD}(1 - Vi) + \sum_{i \in CD}(1 - Vi)$$

$$n(Q4) = \sum_{i \in AB} Vi + \sum_{i \in AC}(1 - Vi) + \sum_{i \in AD}(1 - Vi) + \sum_{i \in BC} Vi + \sum_{i \in BD} Vi + \sum_{i \in CD} Vi$$

Wherein, the notation $i \in AB$ represents that the outputs Vi of all artificial neurons i connected between the small areas A, B are summed. And, the number of wiring routes n(Q1), n(Q2), n(Q3), and n(Q4) are represented by the output Vi of the artificial neuron.

Therefore, the energy function E5 is represented by the quadratic equation of the output Vi of the artificial neuron. Moreover, when the energy function E5 is equal to the extreme small value, the number of wiring routes passing through the boundaries Q1 to Q4 is equal to an average value. That is, the energy function E5 is one of the energy representation utilizing the artificial neural network.

(2.2) Shortening of Each Wiring Route

The restriction condition that each wiring route passing between the small areas is determined as short as possible is represented as follows.

$$E6 = \sum_{i \in AB} Vi + \sum_{i \in AD} Vi + \sum_{i \in BC} Vi + \sum_{i \in CD} Vi \qquad (9)$$

According to the equation (9), in the case where the routes of the wiring nets respectively connected between the small areas A and B, the small areas A and D, the small areas B and C, and the small areas C and D make a detour, the detouring route is penalized. That is, as shown in FIG. 11, the output value Vi of the artificial neuron representing the wiring net is 1 so that the value of the energy function E6 increases.

In other words, in the case where each wiring route is determined as short as possible, the energy function E6 is set to an external minimum value.

Accordingly, the partial problem to determine each wiring route in the four divided small areas A to D can be represented as an energy function of the artificial neural network by utilizing the energy functions E5 and E6. Therefore, the weight parameter Tij between the artificial neurons i, J and the external input parameter Ii to the artificial neuron i can be found in the same manner as described in the first aspect.

That is, in the identity relation between the Hopfield energy function E and the energy function $Ey=eE5+fE6$, by comparing the parameter of the quadratic term of the variable $V_i$ in one energy function with the other, the weight parameters TiJ are found. In the same manner, by comparing the parameter of the linear term of the variable $V_i$ in one energy function with the other, the external input parameters Ii are found.

Basically, by repeating the division of each small area into four pieces, the routes of all wiring nets are determined step by step by finding the parameters Tij, Ii while calculating the energy functions E5 and E6 for each division.

Figure 12:
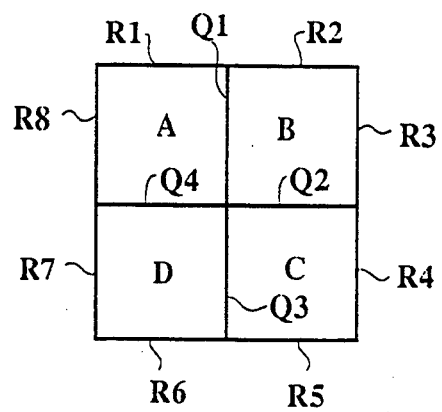
FIG. 12 shows the four small areas shown in FIG. 10 while considering the existence of wiring routes connected to external areas.

However, it is not enough to calculate only the energy functions E5 and E6. That is, the influence of the external region must be considered. For example, external wiring routes coming in and out from/to the external area must be considered. Therefore, in a second embodiment of the second aspect, external boundaries R1 to R8 are considered with the boundaries Q1 to Q4 as shown in FIG. 12 in which the four small areas shown in FIG. 10 is shown while considering the existence of wiring routes passing through the external areas.

That is, as to the wiring net coming in or out from/to the external boundary R1 or R8, it is regarded that one terminal of the wiring net exists in the small area A. In the same manner, as to the wiring net coming in or out from/to the external boundary R2 or R3, the external boundary R4 or R5, and the external boundary R6 or R7, it is regarded that one terminal of the wiring nets respectively exists in the small area B, the small area C, or the small area D. Therefore, the energy functions E5, E6 can be utilized as before. For example, as to the wiring net connected between the boundaries R1, R3, it is regarded that the wiring net connects between the small areas A, B.

Figure 11A:
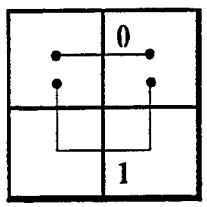
FIGS. 11A to 11F respectively show two patterns of routes of a wiring net connecting between the small areas shown in FIG. 10 through one or more boundaries while satisfying restricting conditions.
Figure 11B:
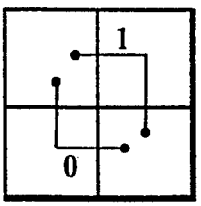
Figure 11C:
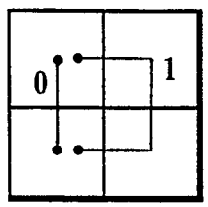
Figure 11D:
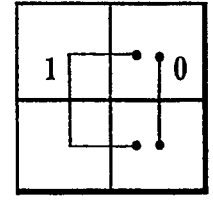
Figure 11E:
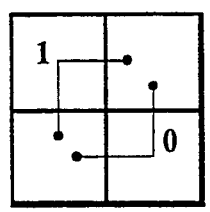
Figure 11F:
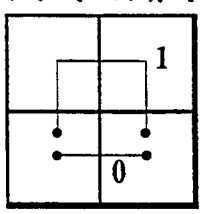
Figure 13A:
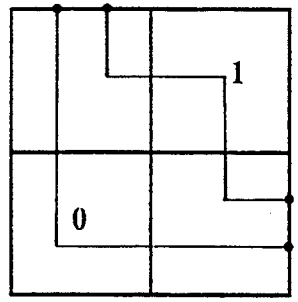
FIGS. 13A to 13D are explanatory views for explaining bent wiring routes in the small area shown in FIG. 12.

However, in the case where the wiring net connected between the boundaries R1, R4 is regarded as the wiring net connected between the small areas A, C, two patterns of routes of the wiring net are thinkable as shown in FIG. 13A in the same manner as in FIG. 11B.

As shown in FIG. 13A, the number of bends in one pattern of the wiring route is 3, while the number of bends in another pattern of the wiring route is 1. Therefore, viewed in the smallest number of bends, the pattern in which the number of the bends is 1 is better.

Figure 13B:
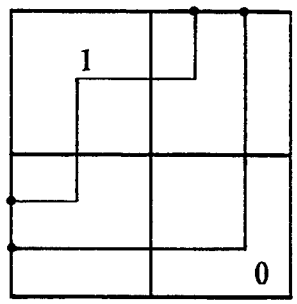
Figure 13C:
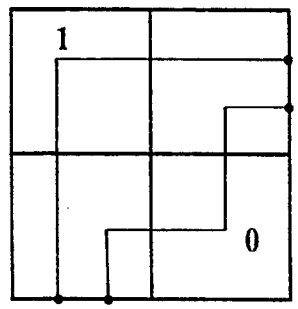
Figure 13D:
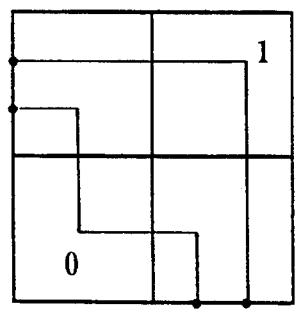

As shown in FIGS. 13B to 13D in the same manner, each wiring net connected between the boundaries R2, R7, the boundaries R3, R6, or the boundaries R5, R8 has two patterns of routes so that the pattern in which the number of the bends is 1 is better.

Accordingly, the restriction condition that the number of bends must be the smallest is represented by a following energy function E7.

$$E7 = \underset{i \in R1-R4}{\Sigma} Vi + \underset{i \in R2-R7}{\Sigma} Vi + \underset{i \in R3-R6}{\Sigma} (1-Vi) + \underset{i \in R5-R8}{\Sigma} (1-Vi) \quad (10)$$

Wherein, the output value Vi of the artificial neuron is 0 when the number of bends is 1, while the output value Vi of the artificial neuron is 1 when the number of bends is 3.

In the equation (10), when the energy function E7 is set to the extreme small value, the restriction condition is satisfied.

Therefore, by respectively multiplying each energy function E5, E6, E7 by proper parameters e, f, g and summing the three multiplied functions eE5, rE6, gE7, the energy function to be found out the extreme small value is represented by the quadratic form of the output Vi of the artificial neuron.

As mentioned above, in the case where the grid area is divided into the four small areas and the routes of the wiring nets connected between the small areas are determined, it must be considered that the number of wiring routes passing through the boundaries is equalized (represented by the energy function E5), each wiring route is determined as short as possible (represented by the energy function E6), and the number of bends of each wiring route is minimized (represented by the energy function E7). (2.3) Division of Boundary Line When each small area A to D is divided into four pieces, each boundary must be divided into two pieces. For example, in the division of boundary Q1, the wiring route passing through the boundary Q1 must be determined which divided boundary the route passes through.

Figure 14:
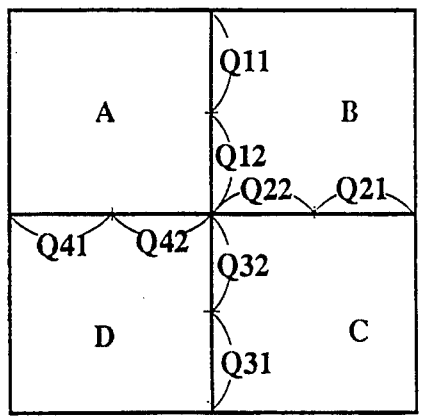
FIG. 14 is an explanatory views for explaining that boundaries between the small areas shown in FIG. 10 are divided into two pieces.

FIG. 14 is an explanatory views for explaining that boundaries between the small areas shown in FIG. 10 are divided into two pieces. As shown in FIG. 14, the number of wiring routes passing through each divided boundary must be equalized. Therefore, the route of the wiring net No. J passing through the boundary Qk is represented by the artificial neuron of which the output is Vkj. When the output value Vkj is 1, the route of the wiring net No. j passes through the divided boundary Qi1. On the other hand, when the output value Vkj is 0, the route of the wiring net No. j passes through the divided boundary Qk2. In this case, the equalization of the wiring routes passing through the divided boundaries Qkm (m=0 or 1) is represented by a following equation.

$$E8 = (n(Q11)-n(Q12))^2 + (n(Q21)-n(Q22))^2 + (n(Q31)-n(Q32))^2 + (n(Q41)-n(Q42))^2 \quad (11)$$

Wherein, the notation n(Qik) represents the number of wiring routes passing through the divided boundaries Qkm. Moreover, each term of the equation (11) is represented by utilizing the output Vkj of the artificial neuron as follows.

$$(n(Q11) - n(Q12))^2 = \left( \underset{j \in AB}{\Sigma} V1j - \underset{j \in AB}{\Sigma} (1 - V1j) \right)^2 \quad (12)$$

$$= \left( \underset{j \in AB}{\Sigma} (2V1j - 1) \right)^2$$

$$(n(Q21) - n(Q22))^2 = \left( \underset{j \in BC}{\Sigma} V2j - \underset{j \in BC}{\Sigma} (1 - V2j) \right)^2$$

$$= \left( \underset{j \in BC}{\Sigma} (2V2j - 1) \right)^2$$

$$(n(Q31) - n(Q32))^2 = \left( \sum_{j \in CD} V3j - \sum_{j \in CD} (1 - V3j) \right)^2$$

$$= \left( \sum_{j \in CD} (2V3j - 1) \right)^2$$

$$(n(Q41) - n(Q42))^2 = \left( \sum_{j \in DA} V4j - \sum_{j \in DA} (1 - V4j) \right)^2$$

$$= \left( \sum_{j \in DA} (2V4j - 1) \right)^2$$

In the division of the boundary, the length of the wiring route must be shortest.

Figure 15:
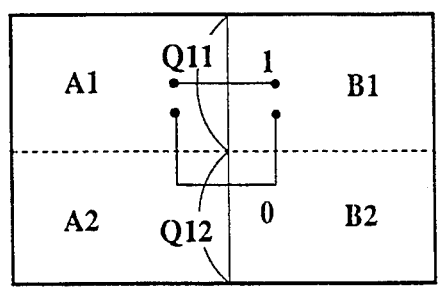
FIG. 15 is an explanatory views for explaining that the shortest wiring route is required in the division of the boundary shown in FIG. 14.
Figure 17A:
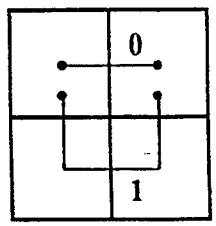
FIGS. 17(a)–17(d) shows possible wiring routes between areas redivided the small area shown in FIG. 12.
Figure 17B:
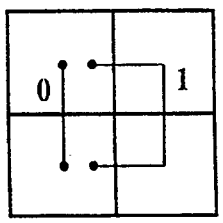
Figure 17C:
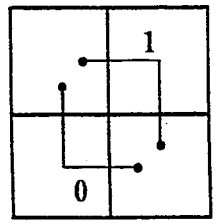
Figure 17D:
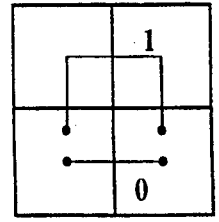

FIG. 15 is an explanatory views for explaining that the shortest wiring route is required in the division of the boundary shown in FIG. 14.

As shown in FIG. 15, each small area A, B is divided into two divided small areas A1, A2 or two divided small areas B1, B2 by dividing the boundary Q1 into the divided boundaries Q11, Q12. And, two patterns of routes of a wiring net connected between the divided small areas A1, B1 are shown.

In FIG. 15, one route of the wiring net shorter than another route is represented by the artificial neuron of which the output value Vkj is 1, while another route is represented by the artificial neuron of which the output value Vkj is 0. In the same manner, two patterns of routes of a wiring net connected between the divided small areas A2, B2 are respectively represented by the artificial neurons of which the output value Vkj is 0 or 1.

Therefore, an energy function E9 to minimize the length of the wiring route passing between the small areas A, B is represented as follows.

$$E9 = \sum_{j \in A1-B1} (1 - V1j) + \sum_{j \in A2-B2} V1j \quad (13)$$

In the equation (13), when the route of the wiring net connected between the divided small areas A1, B1 passes through the divided boundary Q12 and the route of the wiring net connected between the divided small areas A2, B2 passes through the divided boundary Q11, those routes are penalized. That is, the energy function E9 is set to an extreme minimum value when the route of the wiring net connected between the divided small areas A1, B1 passes through the divided boundary Q11 and the route of the wiring net connected between the divided small areas A2, B2 passes through the divided boundary Q12.

In the same manner, energy functions to respectively minimize the length of the wiring route passing between the small areas B, C, the small areas C, D, and the small areas D, A is represented by equations.

As mentioned above, the division of the boundary into two pieces can be performed by utilizing the artificial neural network.

(3) Application of Wiring Method

Processing procedure of the first and second embodiments according to the second aspect is described with reference to the eight wiring nets L1 to L8 shown in FIG. 9.

Figure 16:
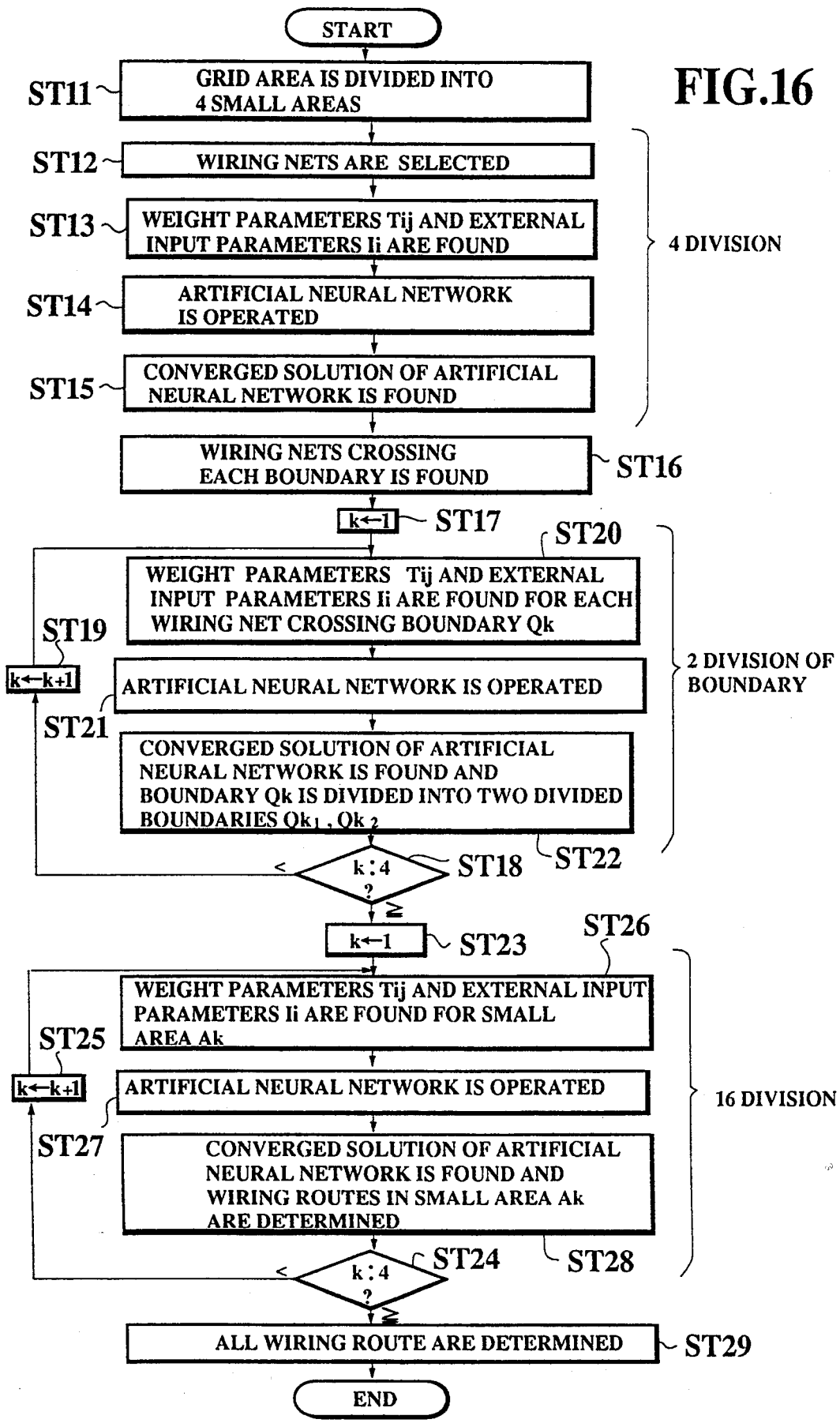
FIG. 16 is a flowchart showing the procedure for determining output values of artificial neurons according to a second aspect of the present invention.

FIG. 16 is a schematic flowchart showing the procedure for determining output values of artificial neurons according to the second aspect of the present invention.

In the schematic flowchart, it is considered that the number of wiring routes passing through the boundaries is equalized (represented by the energy function E5), each wiring route is determined as short as possible (represented by the energy function E6), the number of bends of each wiring route is minimized (represented by the energy function E7), the number of wiring routes passing through the divided boundaries is equalized for each divided boundary (represented by the energy function E8), and the length of each wiring route passing through the divided boundaries is minimized (represented by the energy function E9).

As shown in FIG. 16, in a step ST11, the 4×4 grid area shown in FIG. 8 is divided into the four small areas A, B, C, D as shown in FIG. 10. At this time, the wiring nets L2, L4, L7, and L8 are not considered because the terminals of each wiring net are arranged to an identical small area. For example, the terminals of the wiring net L2 exist in the small area A.

In a step ST12, the wiring nets to be determined the wiring routes passing between the small areas are selected. In the second aspect, the routes of the four wiring nets L1, L3, L5, and L6 are initially determined by utilizing the artificial neural network.

In the case where each wiring route of the four wiring nets L1, L3, L5, and L6 shown in FIG. 9 is determined between the small areas shown in FIG. 10, possible patterns of wiring routes are shown for each wiring net in FIGS. 17(a)–17(d). As shown in FIG. 17, there are two patterns of wiring routes for each wiring net in the same manner as the patterns shown in FIG. 11. Therefore, the output values of the artificial neurons respectively representing the four wiring nets L1, L3, L5, and L6 are set in the same manner as the output values of the artificial neurons shown in FIG. 11. That is, the output value of one artificial neuron representing each wiring net in which the number of bends of the route is smaller and the length of the route is shorter is 0. On the other hand, the output value of another artificial neuron is 1.

In a step ST13, by calculating the sum of the energy functions eE5, fE6, gE7 which are respectively multiplied by parameters and solving the identity equation E=eE5+fE6+gE7 in which the output values $V_i$ of the artificial neurons are variable, the weight parameter Tij between the artificial neurons i, j and the external input parameter Ii of the artificial neuron i are found. That is, as mentioned above, by comparing the parameter of the quadratic term of the variable $V_i$ in one energy function with the other, the weight parameters Tij are found. In the same manner, by comparing the parameter of the linear term of the variable $V_i$ in one energy function with the other, the external input parameters Ii are found.

In a step ST14, the determined weight parameters Tij and external input parameters Ii are substituted for the Hopfield energy function E, then the artificial neural network is operated.

Figure 18:
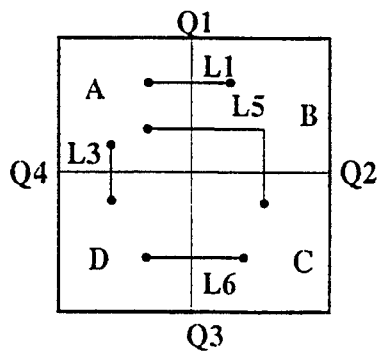
FIG. 18 shows wiring routes passing through boundaries between areas redivided the small area shown in FIG. 12.
Figure 19A:
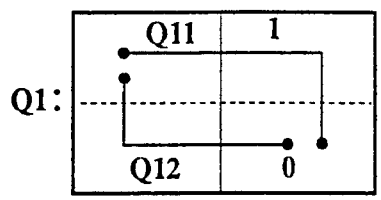
FIGS. 19(a)–19(e) shows possible converged wiring routes which pass through a divided boundary in the small area shown in FIG. 14 in an artificial neural network.
Figure 19B:
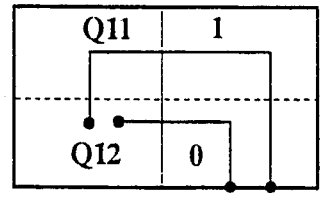
Figure 19E:
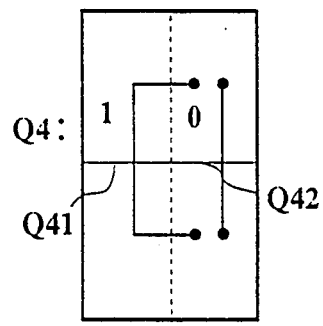
Figure 19C:
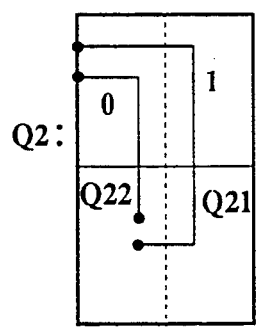
Figure 19D:
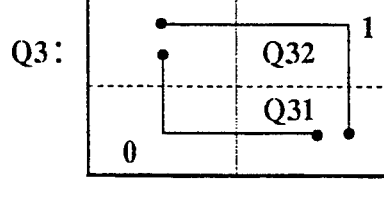

In a step ST15, a converged solution of the artificial neural network is found. The converged solution Vi, which is the output value of the artificial neuron representing the wiring net L1, is V1=0, V3=0, V5=1, V6=0. That is, by substituting the converged solution Vi, the energy function eE5+fE6+gE7 is set to an extreme minimum value. The determined wiring routes of the four wiring nets L1, L3, L5, and L6 are shown in FIG. 18.

Accordingly, in the steps ST11 to ST15, after dividing the 4×4 grid area shown in FIG. 8 into the four small areas, the routes of the wiring nets L1, L3, L5, and L6 connected between the small areas can be determined.

Thereafter, in a step ST16, for preparing the division of the boundaries, the wiring nets of which the routes cross the boundary are found out for each boundary based on the converged solution in the step ST15. As shown in FIG. 18, the boundary Q1 is crossed by the wiring nets L1, L5, the boundary Q2 is crossed by the wiring net L5, the boundary Q3 is crossed by the wiring net L6, and the boundary Q4 is crossed by the wiring net L3.

Then, each boundary is divided into two divided boundaries as shown in FIG. 14. In this case, as mentioned above, it is considered that the number of wiring routes passing through the divided boundaries is equalized for each divided boundary (represented by the energy function E8) and the length of each wiring route passing through the divided boundaries is minimized.

In steps ST17 to ST19, the order of the boundaries which are divided in turn is determined. That is, the division of the boundary is performed by the order of the boundary Q1, the boundary Q2, the boundary Q3, and the boundary Q4.

In a step ST20, by calculating the sum of the energy functions hE8, iE9 which are respectively multiplied by parameters and solving the identity equation E=hE8+iE9 in which the output values Vi of the artificial neurons variable, the weight parameter Tij between the artificial neurons 1, j and the external input parameter Ii of the artificial neuron 1 are found.

In a step ST21, the determined weight parameters Tij and external input parameters Ii are substituted for the Hopfield energy function E, then the artificial neural network is operated.

In a step ST22, a converged solution V1 of the artificial neural network is found. In the operation of the artificial neural network, there are two possible patterns of routes for each wiring net. The possible converged wiring routes which pass through a divided boundary in the small area shown in FIG. 14 is shown in FIGS. 19(a)–(e).

By minimizing the energy function hE8+iE9, the converged solution Vi of the artificial neural network is as follows.
 the boundary Q1: the output value V1=1, V5=0
 the boundary Q2: the output value V5=0
 the boundary Q3: the output value V6=0 or 1 (in this case, V6=1 is selected)
 the boundary Q4: the output value V3=0
Wherein, the outputs of the artificial neurons representing the wiring nets L1, L3, L5, and L6 are respectively V1, V3, V5, and V6.

Figure 20:
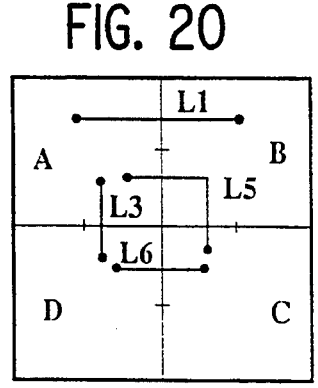
FIG. 20 shows converged routes of wiring nets which pass through prescribed divided boundaries, the wiring nets being shown in FIG. 18.

The converged routes of wiring nets which pass through prescribed divided boundaries Qk1, Qk2 are shown in FIG. 20.

Accordingly, in the steps ST17 to ST22, the routes of wiring nets L1, L3, L5, and L6 passing through the divided boundaries Qk1, Qk2 are determined by utilizing the artificial neural network.

Next, each small area A, B, C, D is redivided into four divided small area so that the wiring nets L2, L4, L7, L8 are considered to determine their routes because the terminals of each wiring net are arranged to different divided small areas from each other.

In steps ST23 to ST15, the order of the small areas to be redivided is determined so that the wiring routes are determined in each small area in turn. That is, a converged solution Vi of the artificial neural network is found in the order of the small area A (A1), the small area B (A2), the small area C (A3), and the small area D (A4).

In a step ST26, in the same manner as in the step ST13, by calculating the sum of the energy functions eE5, fE6, gE7 which are respectively multiplied by parameters and solving the identity equation E=eE5+fE6+gE7 in which the output values $V_i$ of the artificial neurons is variables, the weight parameter Tij between the artificial neurons i, J and the external input parameter Ii of the artificial neuron i are found.

In a step ST27, the determined weight parameters Tij and external input parameters Ii are substituted for the Hopfield energy function E, then the artificial neural network is operated.

In a step ST28, a converged solution Vi of the artificial neural network is found so that the wiring routes are determined for each small area. In the operation of the artificial neural network, there are two possible patterns of routes for each wiring net. The possible converged wiring routes which pass between the divided small area is shown in FIGS. 21(a)–21(m).

FIG. 21 shows two possible patterns of routes of each wiring net L1 to L8 which connects between the divided small areas, wiring routes being shown for each small area and each wiring net.

By minimizing the energy function eE5+rE6+gE7, the converged solution Vi of the artificial neural network is as follows.
 the small area A: the output value V1=0, V2=0, V3=0
 the small area B: the output value V1=1, V4=0
 the small area C: the output value V6=1, V8=0
 the small area D: the output value V3=0, V6=0, V7=0
Wherein, the outputs of the artificial neurons representing the wiring nets L1, L2, L3, L4, and L6 are respectively V1, V2, V3, V4, and V6.

Accordingly, in the steps ST23 to ST28, the routes of wiring nets L1 to L6 passing through the divided small areas are determined for each small area by utilizing the artificial neural network.

In a step ST29, the wiring routes determined for each small area are integrally formed in the grid area shown in FIG. 8.

The converged routes of wiring nets which pass through the divided small areas are arranged in the same manner as the wiring routes shown in FIG. 9.

Accordingly, by repeating the division of the small area, the most suitable solution can be always obtained.

In the second aspect, the grid area is divided into 16 pieces to determine the wiring routes. However, if necessary, the grid area can be divided into 64 pieces, 256 pieces, *** to determine the wiring routes by repeating the division.

Moreover, in the steps ST17 to ST22 and in the steps ST23 to ST28, each corresponding process is repeated 4 times. However, the repeated process can simultaneously be performed by a parallel process.

Further, each wiring net has an individual route. However, it is better that a plurality of wiring nets have the same route. In this case, a weight parameter Wi equivalent to the number of wiring nets is set and the output of the artificial neuron is changed to Wi*Vi instead of Vi.

Furthermore, the energy functions E1 to E9 in the first and second aspects are utilized as an example. In general, the function represented by the quadratic form of the output Vi of the artificial neuron can be easily utilized to determine the wiring route.

Next, artificial neural network wiring apparatuses for performing the method of determining the wiring routes according to the first and second aspects are described.

FIG. 22 is a block diagram of a wiring apparatus for determining wiring routes by utilizing an artificial neural network according to the first aspect.

As shown in FIG. 22, the wiring apparatus comprises:

a dividing section 221 for dividing the grid area into a plurality of small areas A1 to A9;

a representing section 222 for representing each boundary A to L through which one wiring net passes in some possibility as an artificial neuron, each boundary being arranged between the small areas divided by the dividing section 221;

a changing section 223 for changing an output value of the artificial neuron according to the condition whether or not the wiring net actually passes through the boundary which is represented as the artificial neuron by the representing section 222;

a composing section 224 for composing an artificial neural network in which the interaction between the artificial neurons is considered according to one or more prescribed conditions restricting each route of the wiring nets while changing the output values of the artificial neurons by utilizing the changing section 223;

a converging section 225 for converging the output values of all artificial neurons composing the artificial neural network composed by the composing section 224;

a determining section 226 for determining the routes of all wiring nets by judging whether or not each wiring net passes through the boundary represented as the artificial neuron according to the output values of the artificial neurons converged by the converged section 225; and a displaying section 227 for displaying the routes of all wiring nets determined by the determining section 226.

Figure 23:
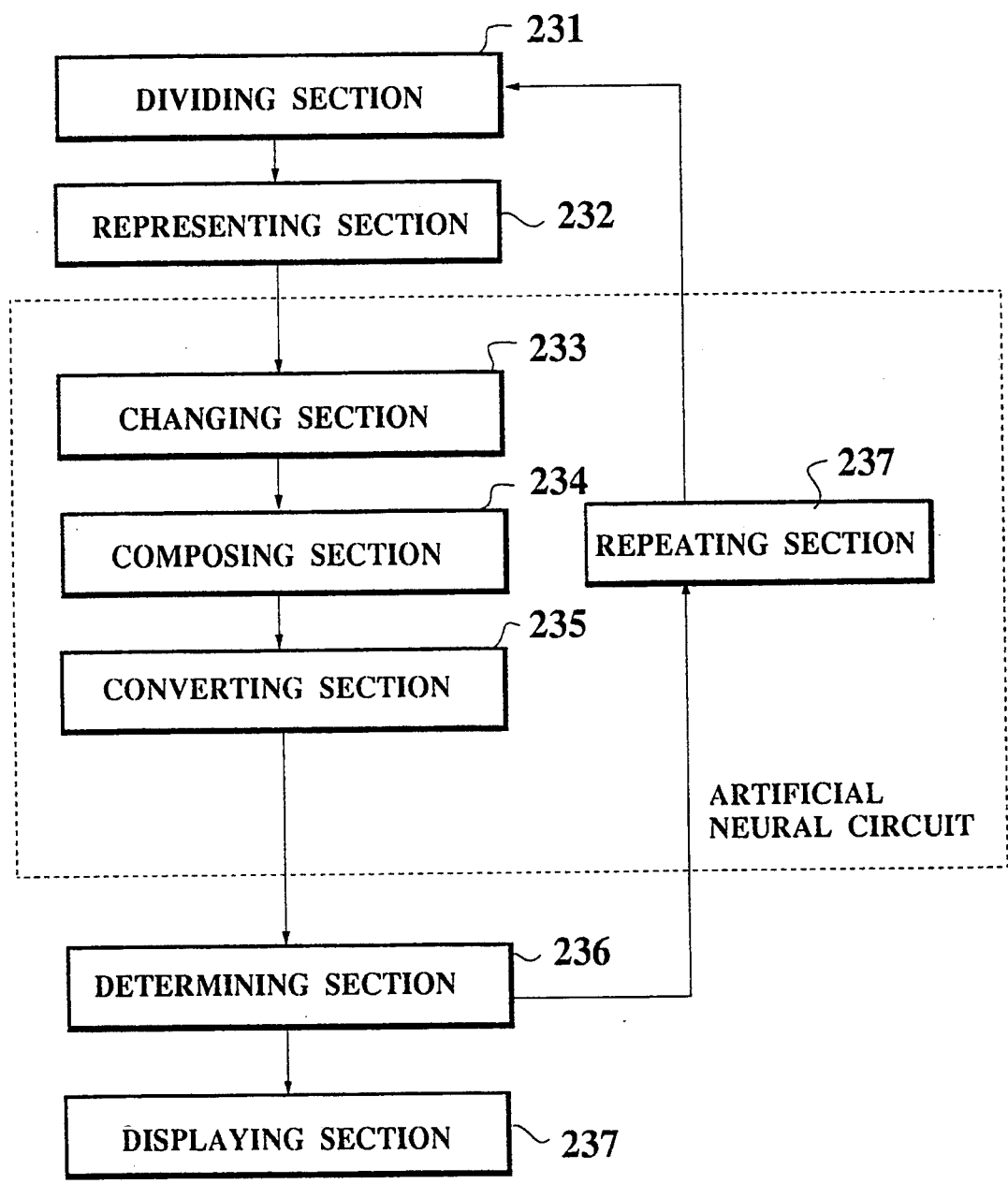
FIG. 23 is a block diagram of a wiring apparatus for determining wiring routes by utilizing an artificial neural network according to the second aspect.

Moreover, FIG. 23 is a block diagram of a wiring apparatus for determining wiring routes by utilizing an artificial neural network according to the second aspect.

As shown in FIG. 23, the wiring apparatus comprises:

a dividing section 231 for dividing the grid area into a prescribed number of small areas;

a representing section 232 for representing each wiring net connecting between the small areas divided by the dividing section 231 as an artificial neuron;

a changing section 233 for changing an output value of the artificial neuron represented by the representing section 232 according to the condition whether or not each route of one wiring net satisfies one or more prescribed restrictions, each route of one wiring net corresponding to one output value of the artificial neuron;

a composing section 234 for composing an artificial neural network in which the interaction between the artificial neurons is considered to select the wiring route satisfying one or more prescribed restrictions while changing the output values of the artificial neurons by utilizing the changing section 233;

a converging section 235 for converging the output values of all artificial neurons composing the artificial neural network composed by the composing section 234;

a determining section 236 for determining the wiring routes corresponding to the output values of the artificial neurons converged by the converging section 235;

a repeating section 237 for repeating the dividing section 231, the representing section 232 for the wiring nets of which the route is determined by the determining section 236 and one or more new wiring nets, the changing section 233, the composing section 234, the converging section 235, and the determining section 236 for determining the routes of the wiring nets in more detail and the routes of the new wiring nets, the repeating section 237 being repeated until the routes of all wiring nets in the wired area are determined; and a displaying section 238 for displaying the routes of all wiring nets determined by the determining section 236.

In the above configurations according to the first and second aspects, the feature of the wiring apparatus according to the first aspect is that the apparatus is provided with an artificial neural circuit having the changing section 223, the composing section 224, and the converging section 225. Moreover, the feature of the wiring apparatus according to the second aspect is that the apparatus is provided with an artificial neural circuit having the changing section 233, the composing section 234, the converging section 235, and the repeating section 237.

Accordingly, the converged solution of the artificial neural circuit can be obtained by utilizing the Hopfield model.

As mentioned above, in each apparatus, the converged solution is obtained by utilizing the artificial neural circuit so that the determination of the wiring routes can be performed in parallel and at a high speed. Moreover, it is not necessary to set a wiring order in which one element in the circuit is connected with another element so that the determination of the wiring routes can be performed with high accuracy compared with the conventional apparatus. Further, the partial problems are solved by utilizing the artificial neural circuit so that the scale of the artificial neural network can be prevented from increasing.

As for the artificial neural network, Hopfield Model is utilized to determine the wiring routes. That is, in the Hopfield Model, the weight parameters and the external input parameters of the artificial neurons are found by defining the energy functions, in which the restrictions of the wiring routes are satisfied, with the quadratic form of the output value of the artificial neuron. Moreover, the artificial neural network represented by the energy functions is always converged to an extreme minimum value. Therefore, by judging the converged solution of the artificial neural network in which the energy is set to the external minimum value, the wiring routes can be easily determined.

As mentioned above, according to the first aspect, to solve the LSI wiring problem, the wiring routes are determined in parallel by utilizing the artificial neural circuit in which the interaction between the routes is considered. Therefore, it is not necessary to set the wiring order in advance different from the conventional method and apparatus.

Accordingly, the problem of the determination of the LSI wiring routes can be solved at a high speed and with high accuracy.

Moreover, according to the second aspect of the present invention, because the LSI wiring problem is divided into the partial problems, the amount of calculation can decrease by utilizing the artificial neural network and a large number of wiring routes can be determined at a high speed. Further, the wiring routes can be determined with high accuracy in the same manner as in the first aspect.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for determining a plurality of wiring routes in an area by utilizing an artificial neural network, comprising the steps of:
   dividing said area into a plurality of smaller areas;
   representing each boundary among said plurality of smaller areas through which one of said plurality of wiring routes is capable of passing as an artificial neuron;
   changing an output value of an artificial neuron in accordance with whether or not a wiring route actually passes through a boundary which is represented as said artificial neuron;
   composing an artificial neural network in which interaction between artificial neurons is taken into consideration according to prescribed conditions restricting each of said plurality of wiring routes while changing output values of said artificial neurons, said prescribed conditions including:
   (1) for each of said wiring routes, at least one route must exist that passes through said boundary without being cut,
   (2) each of said wiring routes must not diverge or join a plurality of said wiring routes at an arbitrary boundary, and
   (3) a number of said wiring routes passing through a boundary must be less than a predetermined number;
   converging said output values of all of said artificial neurons of which said artificial neural network is composed; and
   determining each of said plurality of wiring routes by judging whether or not each of said plurality of wiring routes passes through a boundary represented as an artificial neuron according to said output values of said artificial neurons.

2. A method for determining a plurality of routes of wiring nets in a wired area by utilizing artificial neural networks, comprising the steps of:
   dividing said wired area into a plurality of smaller areas;
   representing each boundary among said plurality of smaller areas through which one of said wiring nets is capable of passing as an artificial neuron;
   changing an output value of an artificial neuron in accordance with whether or not a wiring net actually passes through a boundary which is represented as said artificial neuron;
   composing an artificial neural network in which interaction between artificial neurons is taken into consideration according to prescribed conditions restricting each of said plurality of routes of said wiring nets while changing output values of said artificial neurons, said prescribed conditions including:
   (1) for each of said wiring nets, at least one route must exist that passes through each of said boundaries without being cut,
   (2) a route of each of said wiring nets must not diverge or join a plurality of routes at an arbitrary boundary, and
   (3) a number of routes of said wiring nets passing through a boundary must be less than a predetermined number;
   converging said output values of all of said artificial neurons of which said artificial neural network is composed; and
   determining each of said plurality of routes of said wiring nets by judging whether or not each of said wiring nets passes through a boundary represented as an artificial neuron according to said output values of said artificial neurons.

3. A method for determining a plurality of routes of wiring nets in a wired area by utilizing artificial neural networks, comprising the steps of:
   dividing said wired area into a prescribed number of smaller areas;
   representing each of said wiring nets connecting across boundaries between said smaller areas as an artificial neuron;
   changing an output value of an artificial neuron in accordance with whether or not each route of one of said wiring nets satisfies one or more prescribed restrictions, each route of one of said wiring nets corresponding to one output value of said artificial neuron;
   composing an artificial neural network in which interaction between artificial neurons is taken into consideration to select a route satisfying one or more prescribed restrictions while changing output values of said artificial neurons;
   converging said output values of all of said artificial neurons of which said artificial neural network is composed;
   determining each of said plurality of routes of said wiring nets corresponding to said output values of said artificial neurons; and
   repeating the dividing step after redividing each of said boundaries into a plurality of divided boundaries while taking into consideration said interaction between said artificial neurons according to one or more prescribed restrictions which restrict each of said routes by changing said output values of said artificial neurons, the representing step for representing each of said wiring nets and one or more new wiring nets as artificial neurons, the changing step, the composing step, the converging step, and the determining step for determining each of said plurality of routes of said wiring nets in more detail and routes of said one or more new wiring nets, this repeating step itself being repeated until all of said plurality of routes of said wiring nets in said wired area are determined.

4. The method according to any of claims 2 or 3, wherein an output value of an artificial neuron assumes a binary value.

5. The method according to any of claims 2 or 3, wherein the composing step includes the steps of:
representing said prescribed restrictions by energy functions in which said output values of said artificial neurons are variables;
multiplying each of said energy functions by a suitable parameter to produce multiplied energy functions; and
summing said multiplied energy functions to produce a total energy function.

6. The method according to claims 5, wherein the converging step includes the steps of:
comparing said total energy function with the Hopfield energy function;
determining weight parameters of quadratic terms in said Hopfield energy function by utilizing identity relations between said total energy function and said Hopfield energy function;
determining external input parameters of linear terms in said Hopfield energy function by utilizing said identity relations between said total energy function and said Hopfield energy function; and
calculating an extreme minimum value of said total energy function by utilizing said weight and external input parameters.

7. The method according to claim 3, wherein said prescribed number of smaller areas is equal to 4.

8. The method according to claim 3, wherein one of said one or more prescribed restrictions of the changing step is that a number of routes of said wiring nets passing through each of said boundaries be equalized.

9. The method according to claim 3, wherein one of said one or more prescribed restrictions of the changing step is that each of said wiring nets pass through the shortest possible route.

10. The method according to claim 3, wherein one of said one or more prescribed restrictions of the changing step is that a number of turns of each of said routes be minimized.

11. The method according to claim 3, wherein one of said one or more prescribed restrictions of the step for repeating the dividing step is that a number of said routes passing through each of said plurality of divided boundaries be equalized.

12. The method according to claim 3, wherein one of said one or more prescribed restrictions of the step for repeating the dividing step is that a length of each of said routes passing through each of said plurality of divided boundaries be minimized.

13. An apparatus for determining a plurality of routes of wiring nets in a wired area by utilizing artificial neural networks, comprising:
dividing means for dividing said wired area into a plurality of smaller areas;
representing means for representing each boundary among said plurality of smaller areas through which one of said wiring nets is capable of passing as an artificial neuron;
changing means for changing an output value of an artificial neuron in accordance with whether or not a wiring net actually passes through a boundary which is represented as said artificial neuron;
composing means for composing an artificial neural network in which interaction between artificial neurons is taken into consideration according to prescribed conditions restricting each of said plurality of routes of said wiring nets while changing output values of said artificial neurons via said changing means, said prescribed conditions including:
(1) for each of said wiring nets, at least one route must exist that passes through each of said boundaries without being cut,
(2) a route of each of said wiring nets must not diverge or loin a plurality of routes at an arbitrary boundary, and
(3) a number of routes of said wiring nets passing through a boundary must be less than a predetermined number;
converging means for converging said output values of all of said artificial neurons of which said artificial neural network is composed; and
determining means for determining each of said plurality of routes of said wiring nets by judging whether or not each of said wiring nets passes through a boundary represented as an artificial neuron according to said output values of said artificial neurons converged by said converging means.

14. An apparatus for determining a plurality of routes of wiring nets in a wired area by utilizing artificial neural networks, comprising:
dividing means for dividing said wired area into a prescribed number of smaller areas;
representing means for representing each of said wiring nets connecting across boundaries between said smaller areas as an artificial neuron;
changing means for changing an output value of an artificial neuron represented by said representing means in accordance with whether or not each route of one of said wiring nets satisfies one or more prescribed restrictions, each route of one of said wiring nets corresponding to one output value of said artificial neuron;
composing means for composing an artificial neural network in which interaction between artificial neurons is taken into consideration to select a route satisfying one or more prescribed restrictions while changing output values of said artificial neurons via said changing means;
converging means for converging said output values of all of said artificial neurons of which said artificial neural network is composed;
determining means for determining each of said plurality of routes of said wiring nets corresponding to said output values of said artificial neurons converged by said converging means; and
repeating means for repeating the dividing step after redividing each of said boundaries into a plurality of divided boundaries while taking into consideration said interaction between said artificial neurons according to one or more prescribed restrictions which restrict each of said routes by changing said output values of said artificial neurons, the representing step for representing each of said wiring nets and one or more new wiring nets as artificial neurons, the changing step, the composing step, the converging step, and the determining step for determining each of said plurality of routes of said wiring nets in more detail and routes of said one or more new wiring nets, this repeating by the repeating means itself being repeated until all of said plurality of routes of said wiring nets in said wired area are determined.

15. A method for determining a plurality of routes of wiring nets in a wired area by utilizing artificial neural networks, comprising the steps of:

dividing said wired area into four smaller areas A, B, C and D, the smaller area A being enclosed by four boundaries Q1, Q4, R8, and R1 in clockwise order, the smaller area B being enclosed by four boundaries Q2, Q1, R2, and R3 in clockwise order, the smaller area C being enclosed by four boundaries Q3, Q2, R4, and R5 in clockwise order, and the smaller area D being enclosed by four boundaries Q4, Q3, R6, and R7 in clockwise order;

representing each of said wiring nets connecting across boundaries Q1, Q2, Q3, and Q4 between said four smaller areas A, B, C, and D as an artificial neuron;

changing an output value Vi of an artificial neuron in accordance with whether or not each route of one of said wiring nets satisfies prescribed restrictions, each route of one of said wiring nets corresponding to one output value Vi of said artificial neuron, said prescribed restrictions including:

(1) a number of routes of said wiring nets passing through each of said boundaries Q1, Q2, Q3, and Q4 is equalized, (2) each of said wiring nets pass through the shortest possible route, and (3) a number of turns of each of said routes is minimized;

composing an artificial neural network in which interaction between artificial neurons is taken into consideration to select a route satisfying said prescribed restrictions (1), (2), and (3) while changing output values Vi of said artificial neurons, by representing said prescribed restrictions (1), (2), and (3) by energy functions E5, E6, and E7, respectively, given by:

$$E5 = (n(Q1) - N)^2 + (n(Q2) - N)^2 +$$
$$(n(Q3) - N)^2 + (n(Q4) - N)^2$$

$$E6 = \sum_{i \in AB} Vi + \sum_{i \in AD} Vi + \sum_{i \in BC} Vi + \sum_{i \in CD} Vi$$

$$E7 = \sum_{i \in R1-R4} Vi + \sum_{i \in R2-R7} Vi +$$
$$\sum_{i \in R3-R6} (1 - Vi) + \sum_{i \in R5-R8} (1 - Vi)$$

where N is an average number of wiring routes passing through each boundary, and n(Q1), n(Q2), n(Q3), n(Q4) are numbers of wiring routes passing through the boundaries Q1, Q2, Q3, and Q4, respectively, defined by:

$$n(Q1) = \sum_{i \in AB} (1 - Vi) + \sum_{i \in AC} Vi + \sum_{i \in AD} Vi +$$
$$\sum_{i \in BC} Vi + \sum_{i \in BD} Vi + \sum_{i \in CD} Vi$$

$$n(Q2) = \sum_{i \in AB} Vi + \sum_{i \in AC} Vi + \sum_{i \in AD} Vi + \sum_{i \in BC} (1 - Vi) +$$
$$\sum_{i \in BD} D(1 - Vi) + \sum_{i \in CD} Vi$$

$$n(Q3) = \sum_{i \in AB} Vi + \sum_{i \in AC} (1 - Vi) + \sum_{i \in AD} Vi +$$
$$\sum_{i \in BC} Vi + \sum_{i \in BD} (1 - Vi) + \sum_{i \in CD} (1 - Vi)$$

$$n(Q4) = \sum_{i \in AB} Vi + \sum_{i \in AC} (1 - Vi) + \sum_{i \in AD} (1 - Vi) +$$
$$\sum_{i \in BC} Vi + \sum_{i \in BD} Vi + \sum_{i \in CD} Vi$$

$i \in AB$ indicates the artificial neurons connecting the smaller areas A and B, $i \in AC$ indicates the artificial neurons connecting the smaller areas A and C, $i \in AD$ indicates the artificial neurons connecting the smaller areas A and D, $i \in BC$ indicates the artificial neurons connecting the smaller areas B and C, $i \in BD$ indicates the artificial neurons connecting the smaller areas B and D, $i \in CD$ indicates the artificial neurons connecting the smaller areas C and D, $i \in R1-R4$ indicates the artificial neurons connecting the boundaries R1 and R4, $i \in R2-R7$ indicates the artificial neurons connecting the boundaries R2 and R7, $i \in R3-R6$ indicates the artificial neurons connecting the boundaries R3 and R6, $i \in R5-R8$ indicates the artificial neurons connecting the boundaries R5 and R8;

converging said output values of all of said artificial neurons of which said artificial neural network is composed;

determining each of said plurality of routes of said wiring nets corresponding to said output values of said artificial neurons; and repeating the dividing step, the representing step for representing each of said wiring nets and one or more new wiring nets as artificial neurons, the changing step, the composing step, the converging step, and the determining step for determining each of said plurality of routes of said wiring nets in more detail and routes of said one or more new wiring nets, this repeating step itself being repeated until all of said plurality of routes of said wiring nets in said wired area are determined.

* * * * *